United States Patent
Yu et al.

(10) Patent No.: US 10,395,727 B2
(45) Date of Patent: Aug. 27, 2019

(54) NONVOLATILE METHOD DEVICE AND SENSING METHOD OF THE SAME

(71) Applicant: SAMSUNG ELECTRONICS CO., LTD., Suwon-si, Gyeonggi-do (KR)

(72) Inventors: Chung-Ho Yu, Hwaseong-si (KR); Dae-Seok Byeon, Seongnam-si (KR); Jin-Bae Bang, Anyang-si (KR); Cheon-An Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/922,967

(22) Filed: Mar. 16, 2018

(65) Prior Publication Data
US 2019/0096479 A1    Mar. 28, 2019

(30) Foreign Application Priority Data

Sep. 25, 2017 (KR) .................. 10-2017-0123649

(51) Int. Cl.
| | | |
|---|---|---|
| *G11C 7/00* | (2006.01) | |
| *G11C 11/56* | (2006.01) | |
| *G11C 16/26* | (2006.01) | |
| *G11C 16/24* | (2006.01) | |
| *G11C 16/04* | (2006.01) | |

(52) U.S. Cl.
CPC .......... *G11C 11/5642* (2013.01); *G11C 16/24* (2013.01); *G11C 16/26* (2013.01); *G11C 16/0483* (2013.01)

(58) Field of Classification Search
CPC ...... G11C 11/5642; G11C 16/24; G11C 16/26
USPC .......................................... 365/203
See application file for complete search history.

(56) References Cited

U.S. PATENT DOCUMENTS

| | | |
|---|---|---|
| 7,903,461 B2 | 3/2011 | Chandrasekhar et al. |
| 8,493,784 B2 | 7/2013 | Kang |
| 8,509,007 B2 | 8/2013 | Nirschl et al. |
| 8,873,285 B2 | 10/2014 | Sharon et al. |
| 9,190,161 B2 | 11/2015 | Shibata |
| 9,349,469 B2 | 5/2016 | Chen et al. |
| 9,564,213 B2 | 2/2017 | Sun et al. |
| 2006/0274588 A1* | 12/2006 | Kang ............... G11C 16/24 365/203 |
| 2010/0195407 A1* | 8/2010 | Kim ............... G11C 16/24 365/185.25 |

* cited by examiner

*Primary Examiner* — Vu A Le
(74) *Attorney, Agent, or Firm* — Volentine, Whitt & Francos, PLLC

(57) ABSTRACT

A nonvolatile memory device includes multi-level cells. A sensing method of the nonvolatile memory device includes: precharging a bit line and a sense-out node during a first precharge interval; identifying a first state of a selected memory cell, by developing the sense-out node during a first develop time and sensing a first voltage level of the sense-out node; precharging the sense-out node to a second sense-out precharge voltage; and identifying the first state of the selected memory cell from a second state adjacent thereto, by developing the sense-out node during a second develop time different from the first develop time and sensing a second voltage level of the sense-out node.

20 Claims, 21 Drawing Sheets

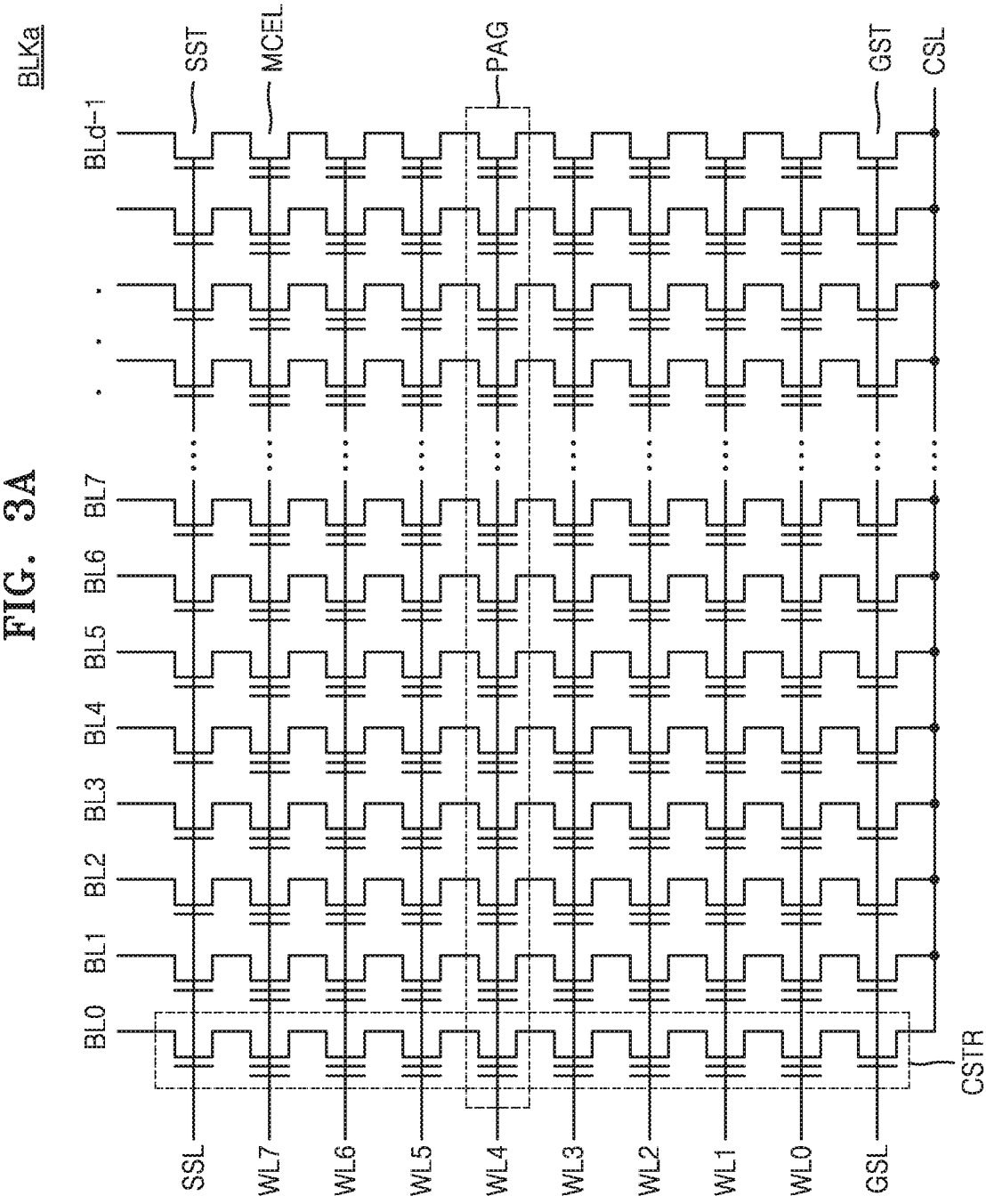

NONVOLATILE METHOD DEVICE AND SENSING METHOD OF THE SAME

CROSS-REFERENCE TO RELATED APPLICATION

This U.S. non-provisional patent application claims the benefit of priority under 35 U.S.C. § 119 to Korean Patent Application No. 10-2017-0123649, filed on Sep. 25, 2017 in the Korean Intellectual Property Office, the disclosure of which is incorporated herein in its entirety by reference.

BACKGROUND

1. Field

The present disclosure relates to a nonvolatile memory device. More particularly, the present disclosure relates to a nonvolatile memory device and a sensing method of the same.

2. Description of Related Art

Semiconductor memory devices may be divided into volatile memory devices that lose data stored therein when power supply is turned off, and nonvolatile memory devices that do not lose data stored therein when the power supply is turned off. The volatile semiconductor memory device may have fast read and write speeds, but content stored therein may be lost when an external power supply is cut off. On the other hand, the nonvolatile semiconductor memory device may have slow read and write speeds compared to the volatile semiconductor memory device, but may retain content therein even when the external power supply is cut off.

In recent years, higher operation speeds have been required in the nonvolatile semiconductor memory device. Accordingly, reductions in time required for reading data from the nonvolatile semiconductor memory device or for verifying a write operation is needed, and various methods to this end have been proposed.

SUMMARY

The present disclosure provides sensing for a nonvolatile memory device, for reducing time needed for bit line voltage precharging by, for example, sensing multiple program states to the bit line voltage precharging only once.

According to an aspect of the present disclosure, a nonvolatile memory device includes multiple multi-level cells. A sensing method of the nonvolatile memory device includes: precharging, during a first precharge interval, a bit line of a selected memory cell and a sense-out node connected to the bit line to a bit line precharge voltage and a first sense-out precharge voltage, respectively; identifying a first state of the selected memory cell, by developing the sense-out node during a first develop time and sensing a first voltage level of the sense-out node at a first sensing point; precharging the sense-out node to a second sense-out precharge voltage during a second precharge interval; and identifying a second state of the selected memory cell, by developing the sense-out node during a second develop time different from the first develop time and sensing a second voltage level of the sense-out node at a second sensing point. The second state is a program state adjacent to the first state.

According to another aspect of the present disclosure, a nonvolatile memory device includes multiple multi-level cells. A sensing method of the nonvolatile memory device includes: precharging a bit line of a selected memory cell and a sense-out node connected to the bit line; applying a first sensing voltage to a selected word line where the selected memory cell is located; developing the sense-out node during a develop interval; and sensing the sense-out node multiple times during the develop interval. The sensing the sense-out node multiple times includes: identifying a first state of the selected memory cell by sensing a first voltage level of the sense-out node at a first sensing point in the develop interval; and identifying a second state of the selected memory cell by sensing a second voltage level of the sense-out node at a second sensing point after the first sensing point. The second state is a program state adjacent to the first state.

According to another aspect of the present disclosure, a nonvolatile memory device includes multiple multi-level cells and is configured to perform multiple sensing loops of a selected memory cell connected to a selected word line. A sensing method of the nonvolatile memory device is performed by at least one sensing loop among the sensing loops and includes: precharging a bit line connected to the selected memory cell during a first precharge interval; precharging a sense-out node connected to the bit line to a first sense-out precharge voltage during the first precharge interval; developing the sense-out node during a develop time; sensing an $i^{th}$ program state (i is an integer) of the selected memory cell by sensing a first voltage level of the sense-out node during a first sensing interval; precharging the sense-out node to a second sense-out precharge voltage during a second precharge interval; developing the sense-out node for a period longer than the develop time by a change amount in the develop time; and sensing an $(i+1)^{th}$ program state of the selected memory cell by sensing a second voltage level of the sense-out node during a second sensing interval.

BRIEF DESCRIPTION OF THE DRAWINGS

Embodiments of the present disclosure will be more clearly understood from the following detailed description taken in conjunction with the accompanying drawings in which:

FIGS. 3A and 3B illustrate a memory block according to an example embodiment of the present disclosure;

DETAILED DESCRIPTION OF THE EMBODIMENTS

Hereinafter, embodiments of the present disclosure will be described in detail with reference to the accompanying drawings.

Figure 1:
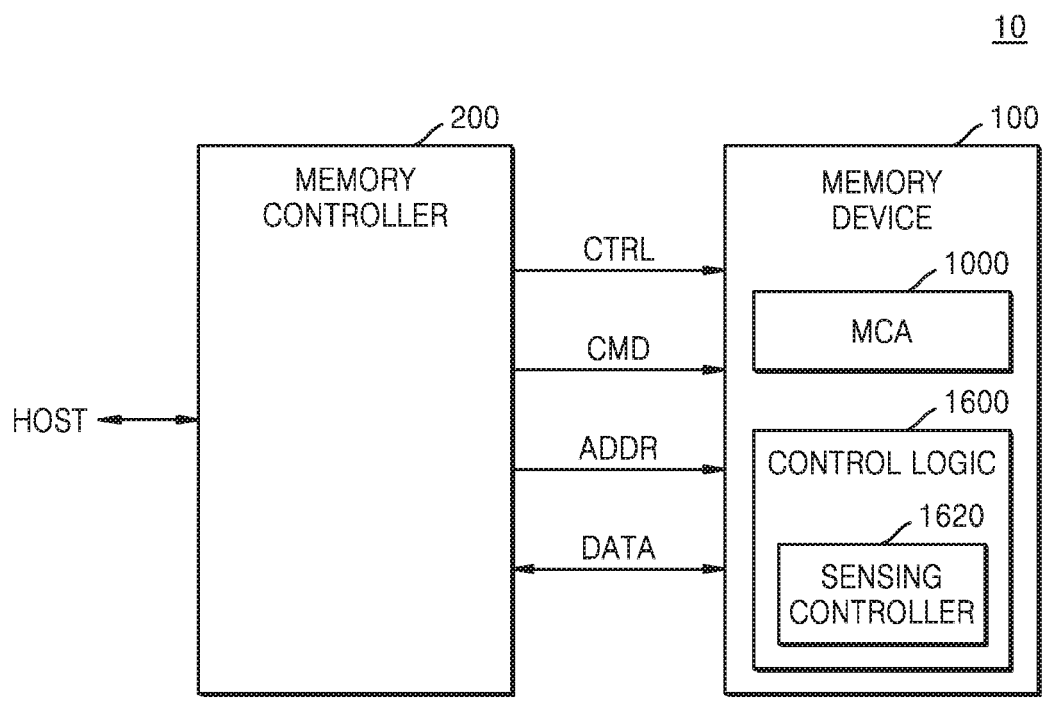
FIG. 1 shows a memory system according to an example embodiment of the present disclosure.

FIG. 1 illustrates a memory system 10 according to an example embodiment of the present disclosure. The memory system 10 may include a memory device 100 and a memory controller 200.

Figure 3B:
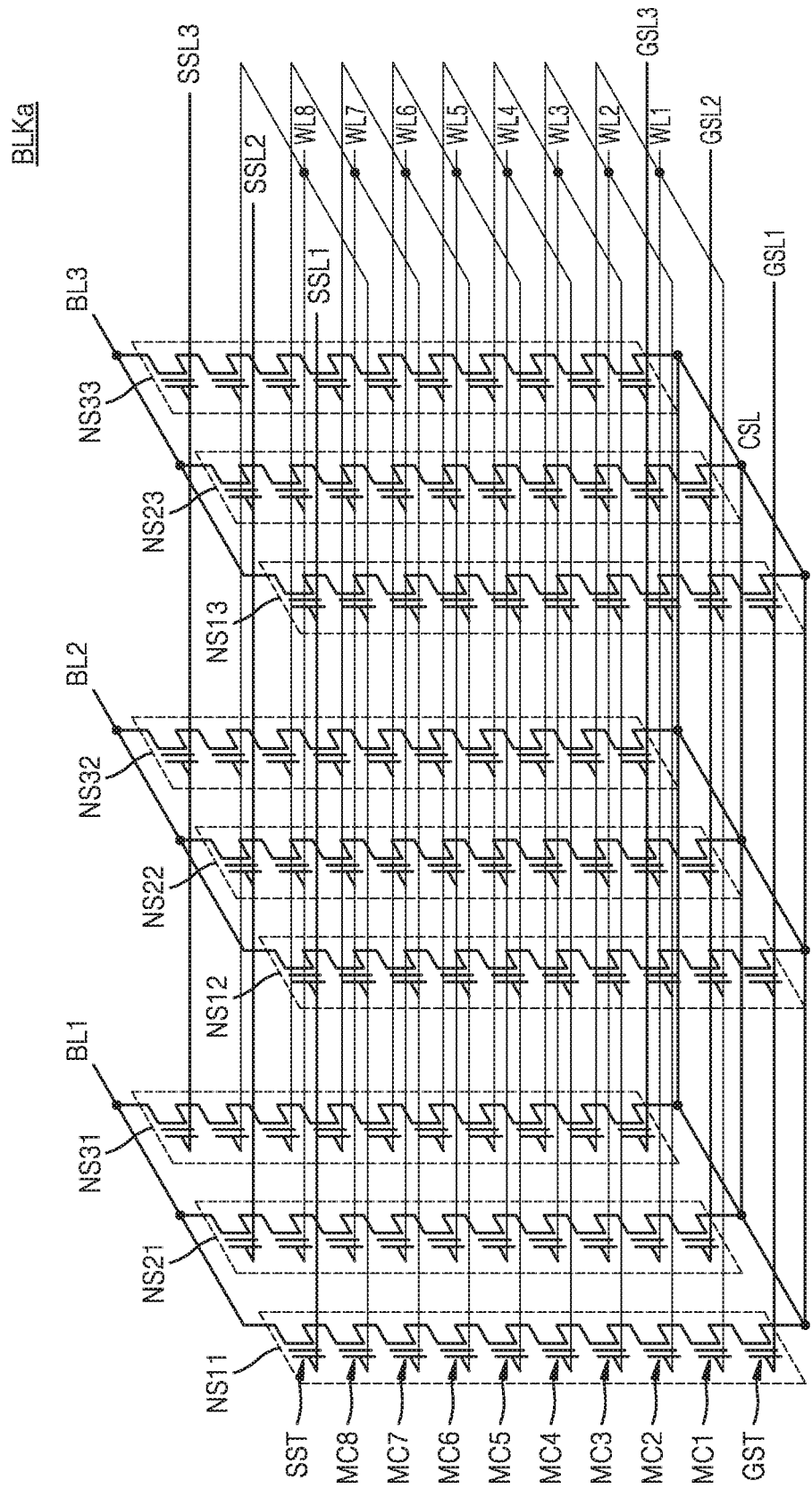

The memory device 100 may perform operations such as writing, reading, and erasing of data DATA in response to signals received from the memory controller 200. The memory device 100 may include a memory cell array 1000 (MCA) and a control logic 1600. Although the memory device 100 is shown as including one memory cell array 1000, embodiments of the present disclosure are not limited thereto. For example, the memory device 100 may include multiple memory cell arrays 1000. The memory cell array 1000 may include multiple memory cells in regions where multiple word lines and multiple bit lines cross each other, and the memory cells may be nonvolatile memory cells. The memory device 100 may include a NAND flash memory, a vertical NAND (VNAND) flash memory, a NOR flash memory, a resistive random-access memory (RAM) (RRAM), a phase-change RAM (PRAM), a magnetoresistive RAM (MRAM), a ferroelectric RAM (FRAM), a spin transfer torque RAM (STT-RAM), etc. The memory device 100 may be implemented as a two-dimensional array structure as shown in FIG. 3A, or may be implemented as a three-dimensional array structure as shown in FIG. 3B. Hereinafter, for the convenience of explanation, it is assumed that the memory device 100 is a NAND flash memory device, but embodiments of the present disclosure are not limited thereto unless when specified.

The memory cell array 1000 may include multiple memory blocks. However, hereinafter, only one block will be shown for convenience of explanation. The memory block may include multiple memory cells. Each memory cell may be a multi-level cell (MLC) storing data of two bits or more. For example, each memory cell may be a 2-bit MLC storing data of 2 bits, a triple-level cell (TLC) storing data of 3 bits, a quadruple level cell (QLC) storing data of 4 bits, or an MLC storing data of 5 bits or more. However, the present disclosure is not limited thereto, and for example, some memory cells may be single level cells (SLC) storing data of 1 bit, while some other memory cells may be the MLCs.

The control logic 1600 may output various internal control signals in the memory device 100 and may control various operations in the memory device 100 as a whole. The control logic 1600 may include a sensing controller 1620. The sensing controller 1620 may control various parameters such as a sense-out precharge voltage and a sensing timing that are needed for the memory device 100 to perform a data read operation or a data write verify operation. The data read operation or the data write verify operation may be referred to as a sensing operation. A detailed description of controlling of the sensing operation may be understood with reference to the following drawings.

The memory controller 200 may control the memory device 100 in response to a request from a host HOST. For example, the memory controller 200 may control the memory device 100 to read the data DATA stored in the memory device 100 or write the data DATA to the memory device 100 in response to a read/write request from the host HOST. The memory controller 200 may control the write, read and erase operations of the memory device 100 by providing an address ADDR, a command CMD and a control signal CTRL to the memory device 100. In addition, the data DATA in the above operations may be transmitted and received between the memory controller 200 and the memory device 100. In other words, the memory controller 200 may interface between the host HOST and the memory device 100.

The memory controller 200 may include RAM, a processing unit, a host interface, and a memory interface. The RAM may be used as an operation memory of the processing unit and the processing unit may control an operation of the memory controller 200. The host interface may include a protocol to perform data exchange between the host HOST and the memory controller 200. For example, the memory controller 200 may be configured to communicate with the host HOST via at least one of various interface protocols such as universal serial bus (USB), multi-media card (MMC), peripheral component interface—express (PCI-E), advanced technology attachment (ATA), serial-ATA, parallel-ATA, small computer system interface (SCSI), enhanced small disk interface (ESDI), and integrated drive electronics (IDE).

The descriptions herein may refer to a controller such as a memory controller 200. A controller may be embodied by a processor that executes a particular dedicated set of software instructions, such as a software module. The processor executes the instructions to control operations of the controller(s).

Any processor (or processing unit) described herein is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor is configured to execute software instructions in order to perform functions as described in the various embodiments herein. A processor may be a general-purpose processor or may be part of an application specific integrated circuit (ASIC). A processor may also be a microprocessor, a microcomputer, a processor chip, a controller, a microcontroller, a digital signal processor (DSP), a state machine, or a programmable logic device. A processor may also be a logical circuit, including a programmable gate array (PGA) such as a field programmable gate array (FPGA), or another type of circuit that includes discrete gate and/or transistor logic. A processor may be a central processing unit (CPU). Additionally, any processor described herein may include multiple processors, parallel processors, or both. Multiple processors may be included in, or coupled to, a single device or multiple devices. Sets of instructions can be read from a computer-readable medium. Further, the instructions, when executed by a processor, can be used to perform one or more of the methods and processes as described herein. In a particular embodiment, the instructions may reside completely, or at least partially, within a main memory, a static memory, and/or within a processor during execution.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

The memory device 100 according to an embodiment of the present disclosure may sense two or more program states after, for example, precharging the bit line once, when performing the data read operation or the data write verify operation, that is, the sensing operation. To this end, the control logic 1600 of the memory device 100 may control a develop time of a sense-out node of a page buffer circuit 1400 (explained below) via a control signal BLSHF in FIG. 6, and may control the sense-out precharge voltage and a word line apply voltage by transmitting a voltage control signal to a voltage generator of the memory device 100. The developing of a selected memory cell by a sense-out node may involve applying a read voltage to a word line of the selected memory cell to be sensed. The read voltage may be referred to as the sensing voltage, and may vary to be lower as (while) the state of the selected memory cell is sensed.

According to an embodiment of the present disclosure, it may be possible to reduce an overall time needed for the sensing operation of the memory device 100 as the number of times of the bit line precharging is reduced.

Figure 2:
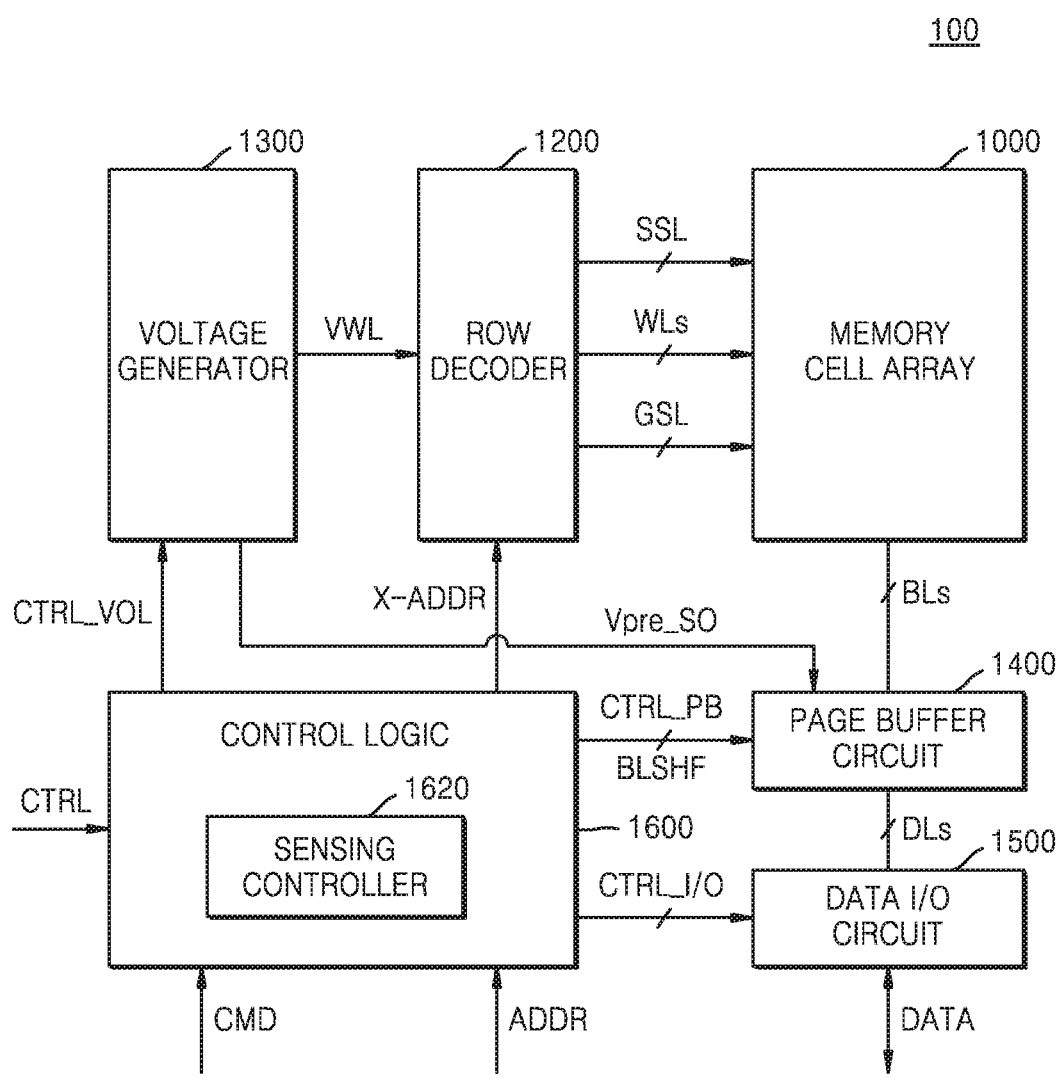
FIG. 2 shows a memory device according to an example embodiment of the present disclosure.

FIG. 2 illustrates a nonvolatile memory device according to an example embodiment of the present disclosure. The nonvolatile memory device may include the memory cell array 1000, a row decoder 1200, a voltage generator 1300, a page buffer circuit 1400, a data input/output circuit 1500, and the control logic 1600. However, a configuration of the nonvolatile memory device is not limited thereto, and may further include other components such as a column decoder. Contents of the nonvolatile memory device that are the same as those in FIG. 1 are omitted, as they may be understood with reference to the description of FIG. 1.

The memory cell array 1000 may be connected to the row decoder 1200 via word lines WL, string select lines SSL, and ground select lines GSL, and may be connected to the page buffer circuit 1400 via the bit lines BL. The memory cell array 1000 may include strings connected to the bit lines BL.

Here, each of the strings may include at least one string selection transistor connected in series between the bit line BL and a common source line CSL, the memory cells, and at least one ground selection transistor. Each of the strings may further include at least one dummy cell between the string selection transistor and the memory cells, and at least one dummy cell between the ground selection transistor and the memory cells.

The row decoder 1200 may select some of the word lines WL based on a row address X-ADDR. The row decoder 1200 may transfer the word line apply voltage to the word line WL. In the data write operation, the row decoder 1200 may apply a programming voltage and a verify voltage to a selected word line WL, and a program inhibit voltage to an unselected word line WL. In the data read operation, the row decoder 1200 may apply a read voltage to the selected word line WL and a read inhibit voltage to the unselected word line WL. In addition, the row decoder 1200 may select some of the string selection lines SSL or some of the ground selection lines GSL in response to a row address X-ADDR.

The voltage generator 1300 may generate various kinds of voltages to perform write, read, and erase operations in the memory cell array 1000 based on a voltage control signal CTRL_VOL. For example, the voltage generator 1300 may generate a word line drive voltage VWL to drive the word lines WL. At this time, the word line drive voltage VWL may be a write voltage, the read voltage, an erase voltage, an inhibit voltage, or a write verify voltage. Although not shown, the voltage generator 1300 may further generate a string select line drive voltage VSSL to drive multiple string select lines SSL, and a ground select line drive voltage VGSL to drive multiple ground select lines GSL. In addition, in a data sensing operation, the voltage generator 1300 may generate a bit line precharge voltage to precharge the bit line BL, and a sense-out precharge voltage Vpre_SO to precharge the sense-out node of the page buffer circuit 1400 based on the voltage control signal CTRL_VOL. The voltage generator 1300 may deliver the sense-out precharge voltage Vpre_SO to the page buffer circuit 1400.

The page buffer circuit 1400 may be connected to the memory cell array 1000 via bit lines BL, and may perform a data write operation or a data read operation in response to a page buffer control signal CTRL_PB received from the control logic 1600. The page buffer circuit 1400 may be connected to data lines DL by selecting the bit lines BL with a decoded column address. Here, the number of the data lines DL may be less than that of the bit lines BL.

The page buffer circuit 1400 may include multiple page buffers that store data DATA to be programmed in the data write operation or store read data DATA in the data read operation. The page buffer circuit 1400 may be implemented to perform a copy-back. The page buffer circuit 1400 and the page buffers will be described in detail with reference to FIG. 4.

The data input/output circuit 1500 may be connected to the page buffer circuit 1400 via the data lines DL, and may supply input data DATA to the page buffer circuit 1400 or output the data DATA provided by the page buffer circuit 1400 to the outside.

The control logic 1600 may generate various internal control signals to store data DATA in the memory cell array 1000 or read data DATA from the memory cell array 1000 based on the command CMD, the address ADDR, and the control signal CTRL received from the memory controller 200. The control logic 1600 may control various operations in the nonvolatile memory device 100 as a whole. Various internal control signals output from the control logic 1600 may be provided to the row decoder 1200, the voltage generator 1300, the page buffer circuit 1400, and the data input/output circuit 1500. For example, the control logic 1600 may provide the row address X-ADDR to the row decoder 1200, the voltage control signal CTRL_VOL to the voltage generator 1300, a page buffer control signal CTRL_PB including the control signal BLSHF to the page buffer circuit 1400, and the input/output control signal CRL_I/O to the data input/output circuit 1500. However, types of the control signals are not limited thereto, and the control logic 1600 may further provide other internal control signals. For example, the control logic 1600 may provide a column address to a column decoder.

The memory device 100 according to an embodiment of the present disclosure may sense two or more program states after precharging the bit line once, when performing the data read operation or the data write verify operation, that is, the sensing operation. To this end, the control logic 1600 of the memory device 100 may control the develop time of the sense-out node of the page buffer circuit 1400 via the control signal BLSHF, and may control the sense-out precharge voltage and the word line apply voltage by transmitting the voltage control signal CTRL_VOL to the voltage generator 1300 of the memory device 100. According to embodiments of the present disclosure, it may be possible to reduce the overall time needed for the sensing operation of the memory device 100 as the number of times of the bit line precharge count is reduced.

FIGS. 3A and 3B respectively illustrate a memory block BLKa according to an example embodiment of the present disclosure.

Referring to FIG. 3A, the memory cell array 1000 in FIGS. 1 and 2 may be a memory cell array including a NAND flash memory. In this case, the memory cell array 1000 may include the memory blocks, and FIG. 3A shows an example structure of one memory block BLKa among the memory blocks.

Each memory block BLKa may include d (d is an integer of 2 or more) cell strings CSTR, in which eight memory cells MC are connected in series, that are arranged in a direction from a bit line BL0 to a bit line BLd−1. Each cell string CSTR may include a string selection transistor SST and a ground selection transistor GST which are connected to both ends of the memory cells MC that are connected to each other in series. In addition, the string selection transistor SST may be connected to the string selection line SSL, and the ground selection transistor GST may be connected to the ground selection line GSL.

A NAND flash memory device having a structure as shown in FIG. 3A may perform the erase operation in block units, and may perform the write operation in page PAG units respectively corresponding to the word lines WL0 through WL7. FIG. 3A illustrates an example in which eight pages PAG for eight word lines WL0 through WL7 are provided in one block. However, the blocks of the memory cell array 1000 according to embodiments of the present disclosure may have the numbers of memory cells MC and pages PAG different from those of memory cells MCEL and pages PAG shown in FIG. 3A, respectively.

Referring to FIG. 3B, the memory block BLKa may correspond to one of the memory blocks, and may include multiple NAND strings NS11 through NS33, multiple ground selection lines GLS1 through GSL3, multiple string selection lines SSL1 through SSL3, and the common source line CSL. Here, the number of the NAND strings, the number of the word lines WL, the number of the bit lines BL, the number of the ground selection lines GSL, and the number of the string selection lines SSL may be variously changed according to an embodiment.

The NAND strings NS11, NS21, and NS31 may be between a first bit line BL1 and the common source line CSL, the NAND strings NS12, NS22, and NS32 may be between a second bit line BL2 and the common source line CSL, and the NAND strings NS13, NS23, and NS33 may be between a third bit line BL3 and the common source line CSL. Each NAND string (for example, NS11) may include the string selection transistor SST, the memory cells MC, and the ground selection transistor GST, which are connected to each other in series.

The string selection transistor SST may be connected to each of the corresponding string selection lines SSL1 through SSL3. The memory cells MC may be connected to the corresponding word lines WL1 to WL8, respectively. The ground selection transistor GST may be connected to each of the corresponding ground selection lines GSL1 to GSL3. The string selection transistor SST may be connected to the corresponding bit lines BL1 through BL3 and the ground selection transistor GST may be connected to the ground selection line GSL.

In FIG. 3B, each string is shown as including one string selection transistor SST, but the embodiment of FIG. 3B is not limited thereto, and each string may include a top string selection transistor and a bottom string selection transistor which are connected to each other in series. In addition, in FIG. 3B, each string is shown as including one ground selection transistor GST, but the embodiment of FIG. 3B is not limited thereto, and each string may include a top ground selection transistor and a bottom ground selection transistor which are connected to each other in series. In this case, the top ground selection transistor may be connected to the corresponding ground selection lines GSL1 through GSL3 and the bottom ground selection transistor may be connected to a common ground selection line.

Figure 4:
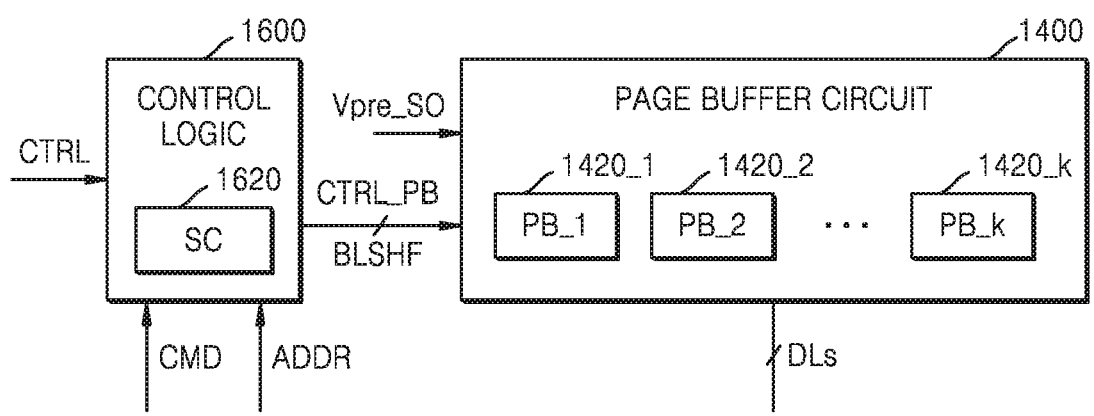
FIG. 4 shows a memory system according to an example embodiment of the present disclosure.

FIG. 4 illustrates a page buffer circuit 1400 and a control logic 1600 according to an example embodiment of the present disclosure. Contents of the page buffer circuit 1400 and the control logic 1600 that overlap those described with reference to FIGS. 1 and 2 will be omitted.

The page buffer circuit 1400 may include multiple page buffers 1420_1 through 1420_k (k is a natural number of 2 or more). Each of the page buffers 1420_1 through 1420_k may be connected to some bit lines of the bit lines BL0 through BLm−1 (m is an integer of 2 or more). Each of the page buffers 1420_1 through 1420_k may include multiple latches such as a sensing latch, a data latch, and a cache latch, and may further include a precharge circuit and a bit line selection circuit. Configuration and operation of the respective page buffers 1420_1 through 1420_k will be understood in more detail with reference to FIG. 6.

The page buffer circuit 1400 according to embodiments of the present disclosure may receive a page buffer control signal CTRL_PB from the control logic 1600. The page buffer control signal CTRL_PB may control an operation of the page buffer circuit 1400. For example, the page buffer control signal CTRL_PB may include the control signal BLSHF, and the control signal BLSHF may control the develop time of the sense-out node of the page buffer circuit 1400. The control logic 1600 may control the sense-out precharge voltage Vpre_SO delivered to the page buffer circuit 1400 via the voltage generator 1300 in FIG. 2. In an embodiment, the control logic 1600 may include the sensing controller 1620, and the sensing controller 1620 may control generation of the control signal BLSHF and the sense-out precharge voltage Vpre_SO. In an example embodiment of the present disclosure, the sense-out precharge voltage Vpre_SO may have different values in a first precharge interval and a second precharge interval.

Figure 5A:
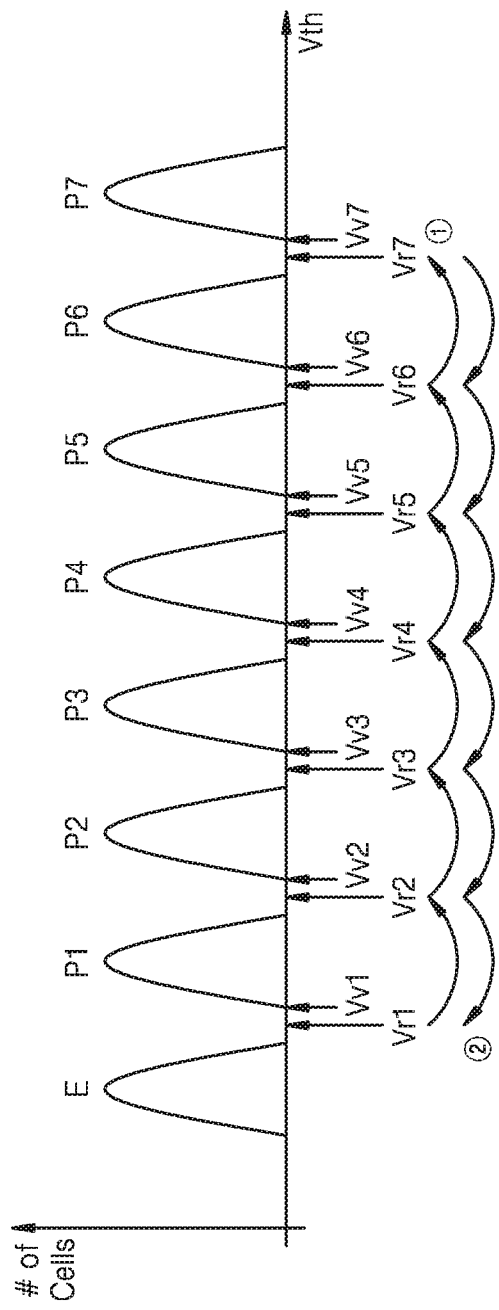
FIGS. 5A and 5B respectively illustrate distributions of threshold voltages of a memory cell according to an example embodiment of the present disclosure.
Figure 5B:
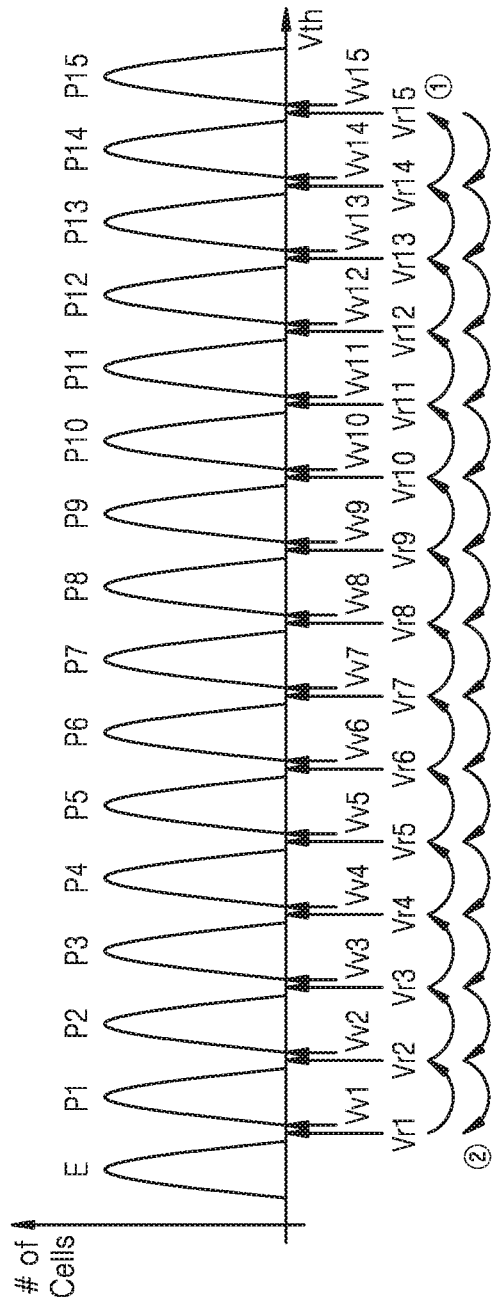

FIGS. 5A and 5B respectively illustrate distributions of threshold voltages of the memory cell MC according to an example embodiment of the present disclosure. In particular, FIG. 5A illustrates a distribution when the memory cell MC is the TLC of a 3-bit MLC, and FIG. 5B shows a distribution when the memory cell MC is the QLC of a 4-bit MLC.

Referring to FIG. 5A, a horizontal axis may represent the threshold voltage Vth, and a vertical axis may represent the number of memory cells MC. When the memory cell MC is the TLC to be programmed with 3 bits, the memory cell MC may have one of an erase state E, and a first through seventh program states P1 through P7. More electrons may be injected into a floating gate of the memory cell MC as the threshold voltage Vth changes from the erase state E to the seventh program state P7. In FIG. 5A, the smaller threshold voltage among threshold voltages for any first group of two adjacent program states P2 through P7 is greater than the larger threshold voltage among threshold voltages for any second group of two adjacent states to the left of the first group, from the erase state E through the program state P5. In the context of the present disclosure, "adjacent" program states may be taken to mean that two program states are immediately adjacent along the X axis shown in the Figures, i.e., without an intervening program state therebetween.

A first read voltage Vr1 may have a voltage level between a voltage of a distribution of the memory cell MC in the erase state E and a voltage of a distribution of the memory cell MC having the first program state P1. A second read voltage Vr2 may have a voltage level between a voltage of the distribution of the memory cell MC in the first program state P1 and a voltage of a distribution of the memory cell MC having the second program state P2. Similarly, an $i^{th}$ read voltage Vri may have a voltage level between a voltage of the distribution of the memory cell MC in an $(i-1)^{th}$ program state Pi-1 and a voltage of a distribution of the memory cell MC having an $i^{th}$ program state Pi (i is an integer equal to or greater than 2, and equal to or less than 7).

A first verify voltage Vv1 may have a voltage level of a lowest threshold voltage of the distribution of the memory cell MC having the first program state P1. Similarly, an $i^{th}$ verify voltage Vvi may have a voltage level of a lowest threshold voltage of the distribution of the memory cell MC having the $i^{th}$ program state Pi (i is an integer equal to or greater than 2, and equal to or less than 7).

For example, when the first read voltage Vr1 is applied to the word line WL of a selected memory cell MC, the memory cell MC in the erase state E may be turned on while the memory cell MC in the first program state P1 may be turned off. When the memory cell MC is turned on, a current may flow through the memory cell MC, and when the memory cell MC is turned off, a current may not flow through the memory cell MC. Accordingly, the data stored in the memory cell MC may be distinguished depending on whether the memory cell MC is turned on.

In addition, a program of a memory cell MC may be inhibited. For example, when a write operation is performed to the selected memory cell MC in the second program state P2 and a second verify voltage Vv2 is applied to a word line WL of the selected memory cell MC in the write verify operation, and the threshold voltage Vth of the memory cell MC may become higher than the second verify voltage Vv2. In this circumstance, a program of the corresponding memory cell MC may be inhibited.

The data read operation or the data write verify operation according to the example embodiment of the present disclosure may use a HSR method that is neither a most significant bit (MSB) method nor a least significant bit (LSB) method verifying the read voltage or the verify voltage by skipping (for example, verifying a Vr4 read voltage after verifying the first read voltage Vr1). The HSR method may include reading or verifying the $i^{th}$ program state, and then may include reading or verifying a program state adjacent to the $i^{th}$ program state.

Thus, a forward HSR sensing operation □ may be performed in which the sensing operation is sequentially performed from the first read voltage Vr1 or the first verify voltage Vv1 to a seventh read voltage Vr7 or a seventh verify voltage Vv7. A backward HSR sensing operation □ may be performed in which the sensing operation is sequentially performed from the seventh read voltage Vr7 or the seventh verify voltage Vv7 to the first read voltage Vr1 or the first verify voltage Vv1.

Referring to FIG. 5B, the horizontal axis may represent the threshold voltage Vth, and the vertical axis may represent the number of memory cells. When the memory cell is the QLC programmed in 4 bits, the memory cell may have one of the erase state E and the first through fifteenth program states P1 through P15. More electrons may be injected into the floating gate of the memory cell as a state moves from the erase state E to the fifteenth program state P15.

The first read voltage Vr1 may have a voltage level between the distribution of the memory cell having the erase state E and the distribution of the memory cell having the first program state P1. The second read voltage Vr2 may have a voltage level between the distribution of the memory cell having the first program state P1 and the distribution of the memory cell having the second program state P2. Similarly, the $i^{th}$ read voltage Vri may have a voltage level between the distribution of the memory cell having then $(i-1)^{th}$ program state Pi-1 and the distribution of the memory cell having the $i^{th}$ program state Pi (i is an integer equal to or greater than 2, and equal to or less than 15).

The first verify voltage Vv1 may have a voltage level of the lowest threshold voltage of the distribution of the memory cell having the first program state P1. Likewise, the $i^{th}$ verify voltage Vri may have a voltage level of the lowest threshold voltage of the distribution of the memory cell having the $i^{th}$ program state Pi (i is an integer equal to or greater than 2, and equal to or less than 15). In FIG. 5B, the smaller threshold voltage among threshold voltages for any first group of two adjacent program states P2 through P15 is greater than the larger threshold voltage among threshold voltages for any second group of two adjacent states to the left of the first group from the erase state E through the program state P13.

For example, when the first read voltage Vr1 is applied to the word line WL of the selected memory cell, the memory cell in the erase state E may be turned on while the memory cell in the first program state P1 is turned off. When the memory cell is turned on, the current may flow through the memory cell, and when the memory cell is turned off, the current may not flow through the memory cell. Accordingly, the data stored in the memory cell may be distinguished depending on whether the memory cell is turned on.

As noted above, the program of a memory cell may be inhibited. For example, when a write operation is performed to a selected memory cell in a second program state P2 and a second verify voltage Vv2 is applied to a word line WL of a selected memory cell at the write verify operation, the threshold voltage of the memory cell may become higher than the second verify voltage Vv2. In this circumstance, the program of the corresponding memory cell may be inhibited.

The data read operation or the data write verify operation according to the example embodiment of the present disclosure may use the HSR method. The HSR method may include a scheme in which the $i^{th}$ program state is read or verified and then, a program state adjacent to the $i^{th}$ program state is read or verified. The sensing operation by the HSR method may include the forward HSR sensing operation ☐ and the backward HSR sensing operation ☐. Hereinafter, for convenience of explanation, the sensing operation will be described as the data read operation, but the sensing operation method may also be applied to the data write verify operation.

Figure 6:
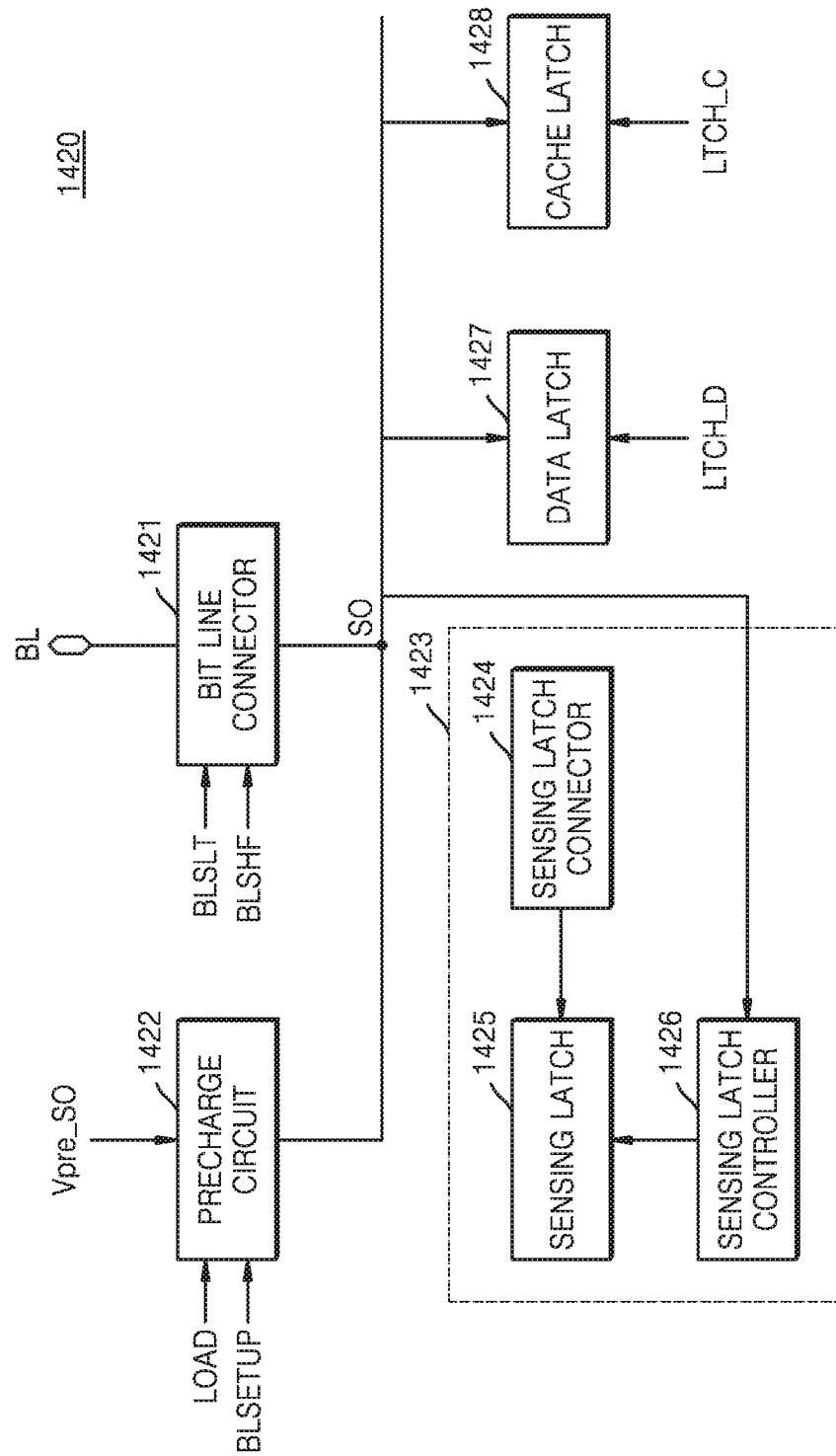
FIG. 6 shows a page buffer according to an example embodiment of the present disclosure.

FIG. 6 illustrates a page buffer 1420 according to an embodiment of the present disclosure.

Referring to FIG. 6, the page buffer 1420 may include a bit line connector 1421, a precharge circuit 1422, a sensing unit 1423, a data latch 1427, and a cache latch 1428.

The bit line connector 1421 may selectively connect the memory cell included in the memory cell array via the bit line BL based on the control signal BLSLT and the control signal BLSHF, with/to the sense-out SO node. The bit line connector 1421 may be activated by a bit line connection control signal provided by the memory controller 200 in FIG. 1.

The precharge circuit 1422 may, in the data sensing operation, selectively precharge the sense-out SO node based on a load signal LOAD and a setup signal BLSETUP in the precharge interval. The precharge circuit 1422 may receive the sense-out precharge voltage Vpre_SO from the voltage generator 1300 in FIG. 2. The sense-out precharge voltage Vpre_SO inputted from the voltage generator 1300 may be changed during the data sensing operation. For example, according to an embodiment of the present disclosure, the sense-out SO node may be precharged to a first sense-out precharge voltage in a first precharge interval, and may be precharged to a second sense-out precharge voltage in a second precharge interval after having passed a develop interval. A longer develop time may be obtained as needed by changing the sense-out precharge voltage.

The sensing unit 1423 may include a sensing latch connector 1424, a sensing latch 1425, and a sensing latch controller 1426. The sensing latch connector 1424 may selectively deliver a voltage of the sense-out SO node to an input terminal of the sensing latch 1425. The sensing latch 1425 may latch a voltage of the input terminal thereof and transmit it to an output terminal thereof. The sensing latch controller 1426 may control the voltages of the input and output terminals of the sensing latch 1425 based on the sense-out SO node voltage and other control signals.

Figure 7:
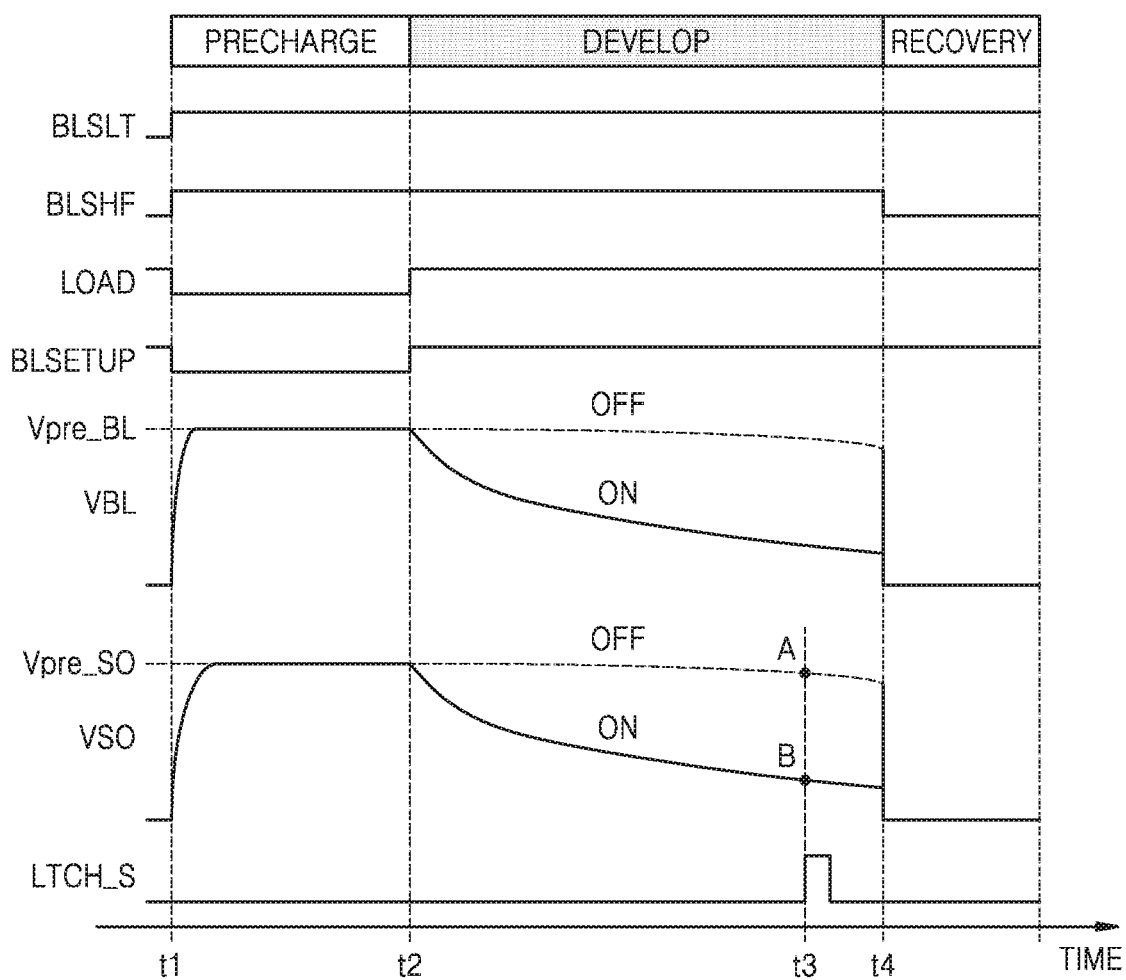
FIG. 7 shows a sensing operation timing diagram according to an example embodiment of the present disclosure.

FIG. 7 is a sensing operation timing diagram of a nonvolatile memory device according to an example embodiment of the present disclosure. FIG. 7 may be explained with reference to FIG. 6. The sensing operation of the nonvolatile memory device may include a precharge interval and a develop interval.

In the precharge interval (t1 to t2), the control signal BLSLT and the control signal BLSHF may be turned on. Thus, the bit line BL and the sense-out SO node may be connected. In addition, the sense-out SO node may be connected to the sense-out precharge voltage Vpre_SO node as the load signal LOAD and the setup signal BLSETUP are transitioned to about 0 or a ground voltage Vss. Thus, both the bit line BL and the sense-out SO node may be precharged. The bit line BL may be precharged to the bit line precharge voltage Vpre_BL and the sense-out SO node may be precharged to the sense-out precharge voltage Vpre_SO.

When the load signal LOAD and the setup signal BLSETUP are turned on in a develop interval (t2 through t4), a connection between the precharge circuit 1422 and the sense-out SO node may be released. At the time t2, a path leading to the sense-out SO node, the bit line BL, and the memory cell array may be formed. Although not shown in FIG. 7, at the time t2, a read voltage may be applied to the word line WL of the selected memory cell to be sensed. The readout voltage may be referred to as the sensing voltage.

When the selected memory cell to be sensed corresponds to an OFF cell, a channel path may not be formed in the selected memory cell. As a result, charges precharged to the bit line BL and the sense-out SO node may not be discharged. Accordingly, both the bit line voltage VBL and the sense-out node voltage VSO may be maintained at a constant level or a substantially constant level (e.g., within 25% of the starting voltage, or within 10% of the starting voltage) in the develop interval.

On the other hand, when the selected memory cell to be sensed corresponds to an ON cell, the channel path may be formed in the selected memory cell. As a result, the charges precharged to the bit line BL and the sense-out SO node may be discharged. Accordingly, both the bit line voltage VBL and the sense-out node voltage VSO in the develop interval may be greatly reduced.

The bit line voltage VBL and the sense-out voltage VSO may be changed in the development interval (t2 through t4) according to a state of the cell as described above, which is referred to as the sense-out node voltage VSO being developed in the develop interval.

The voltage level of the sense-out node voltage VSO may be sensed according to a sensing latch signal LTCH_S at the third sensing point t3 of the develop interval. When the selected memory cell to be sensed corresponds to an OFF cell, the sense-out node voltage VSO may be located at a point A at the time t3 (i.e., at the same or substantially the same level as the starting voltage). On the other hand, when the selected memory cell to be sensed corresponds to the ON-cell, the sense-out node voltage VSO may be located at a point B at the time t3. Since the sense-out node voltages VSO are different at the point A and the point B, a sensing operation to distinguish whether the selected memory cell is an ON-cell or an OFF-cell may be performed by using this difference in the sense-out node voltages VSO.

Figure 8A:
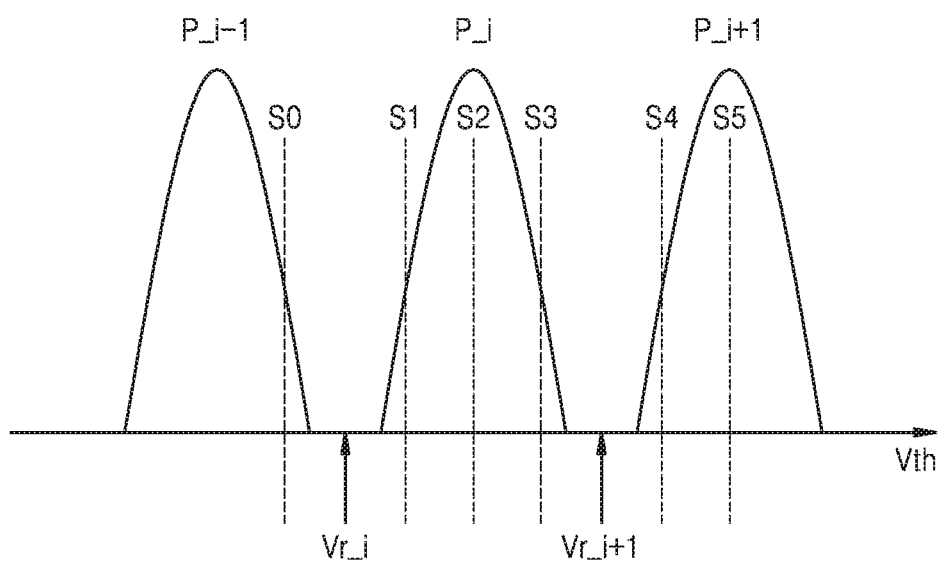
FIG. 8A shows a portion of a distribution according to the threshold voltage of a multi-level cell according to an example embodiment of the present disclosure.

FIG. 8A illustrates a portion of a distribution according to the threshold voltage of the multi-level cell according to an example embodiment of the present disclosure. FIG. 8A shows the $(i-1)^{th}$ program state P_i-1, the $i^{th}$ program state P_i, and the $(i+1)^{th}$ program state P_i+1. The $i^{th}$ read voltage Vr_i for distinguishing the $i^{th}$ program state P_i from the $(i-1)^{th}$ program state P_i-1 may have a value between the distribution of the $(i-1)^{th}$ program state P_i-1 and the distribution of the $i^{th}$ program state P_i. The $(i+1)^{th}$ read voltage Vr_i+1 for distinguishing the $(i+1)^{th}$ program state P_i+1 from the $i^{th}$ program state P_i may have a value between the distribution of the $i^{th}$ program state P_i and the distribution of the $(i+1)^{th}$ program state P_i+1. The $i^{th}$ read voltage Vr_i and the $(i+1)^{th}$ read voltage Vr_i+1 may be referred to as an $i^{th}$ sensing voltage Vr_i and an $(i+1)^{th}$ sensing voltage Vr_i+1, respectively.

Figure 8B:
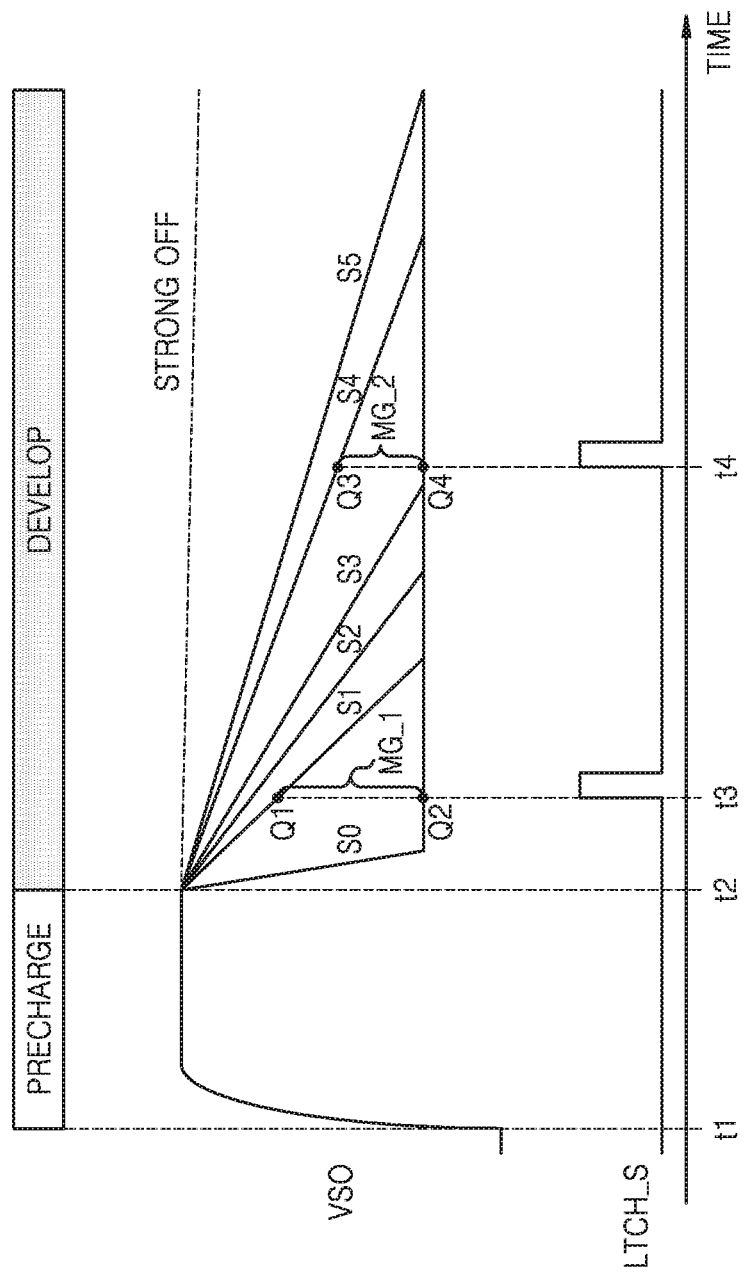
FIG. 8B shows a sensing operation timing diagram according to an example embodiment of the present disclosure.

A memory cell corresponding to a line S0 may be a cell in the distribution of the $(i-1)^{th}$ program state P_i-1, memory cells corresponding to lines S1, S2, and S3 may be cells in the distribution of the $i^{th}$ program state P_i, respectively, and memory cells corresponding to lines S4 and S5 may be cells in the distribution of the $(i+1)^{th}$ program state P_i+1. FIG. 8B illustrates a time-dependent graph of the sense-out node voltage VSO when the selected memory cells are memory cells corresponding to the lines S0 through S5 in the develop interval of the sensing operation, respectively.

FIG. 8B shows a sensing operation timing diagram according to an example embodiment of the present disclosure. The sensing operation timing diagram in FIG. 8B may be explained with reference to FIG. 8A.

In the precharge interval (t1 to t2), the sense-out node voltage VSO may be precharged. At the time t2, the precharge interval may be over and the develop interval may start.

Since a path leading to the sense-out SO node, the bit line BL, and the memory cell array MCA is formed in the develop interval (t2 and beyond), the sense-out node voltage VSO may be different depending on the state of the selected memory cell. A graph of the develop interval is shown on an assumption that the $i^{th}$ read voltage Vr_i is applied to the selected word line WL where the selected memory cell is located.

When the selected memory cell is a memory cell located on the line S0 in FIG. 8A, the threshold voltage of the selected memory cell may be less than voltage applied to the word line WL. As a result, the selected memory cell may be a strong ON-cell. Since the selected memory cell corresponds to a strong ON-cell located on the line S0, a channel path may be formed in the selected memory cell and a precharged charge may be discharged through the formed channel path. As a result, the sense-out node voltage VSO may rapidly reach a low value.

On the other hand, when the selected memory cell is a memory cell having the threshold voltage greater than the line S5, the selected memory cell may be a strong OFF-cell. Since the selected memory cell corresponds to a strong OFF-cell, the channel path may not be formed in the selected memory cell, and an amount of change in the sense-out node voltage VSO may be insignificant because the precharged charge may not be discharged.

When the selected memory cell is a memory cell located on the line S1 in FIG. 8A, the threshold voltage of the selected memory cell may be less than a voltage applied to the word line. As a result, the sense-out node voltage VSO may more gradually decrease compared with the line S0 and reach a final value.

As the selected memory cell moves from the line S2 to the line S5 in FIG. 8A, the threshold voltage of the selected memory cell may become greater than the voltage applied to the word line WL, so that a slope at which the sense-out node voltage VSO decreases may gradually become gentle (lower).

At the t3, a first sensing may be performed by the sensing latch signal LTCH_S. At the time t3, the sense-out node voltage VSO may be located at Q2 or Q1, depending on whether the selected memory cell is located on the line S0 or on the line S1, respectively. Thus, the selected memory cell on the line S0 and the selected memory cell on the line S1 may be identified by using a sensing margin of a first sensing margin MG_1. Accordingly, it may be possible to identify (distinguish) the $i^{th}$ program state P_i from the $(i-1)^{th}$ program state P_i-1 by applying the $i^{th}$ read voltage Vr_i to the word line WL.

At the time t4, a second sensing may be performed by the sensing latch signal LTCH_S. At the time t4, the sense-out node voltage VSO may be located at Q4 or Q3, depending on whether the selected memory cell is located on the line S3 or on the line S4, respectively. Thus, the selected memory cell on the line S3 and the selected memory cell on the line S4 may be identified by using a sensing margin of a second sensing margin MG_2. Accordingly, it may be possible to identify the $(i+1)^{th}$ program state P_i+1 from the $i^{th}$ program state P_i by applying the $i^{th}$ read voltage Vr_i to the word line WL.

According to FIGS. 8A and 8B, when a long develop interval is ensured, it may be possible to identify two program states by using one word line voltage and one bit line precharge. In other words, when the develop interval is kept long, it may be possible to obtain the same effect as increasing the voltage applied to the word line WL, without increasing the voltage applied to the word line WL. In FIGS. 9A through 9C, 10A and 10B, 11, and 12, an embodiment is provided to identify two program states from each other by one bit line precharge.

Figure 8C:
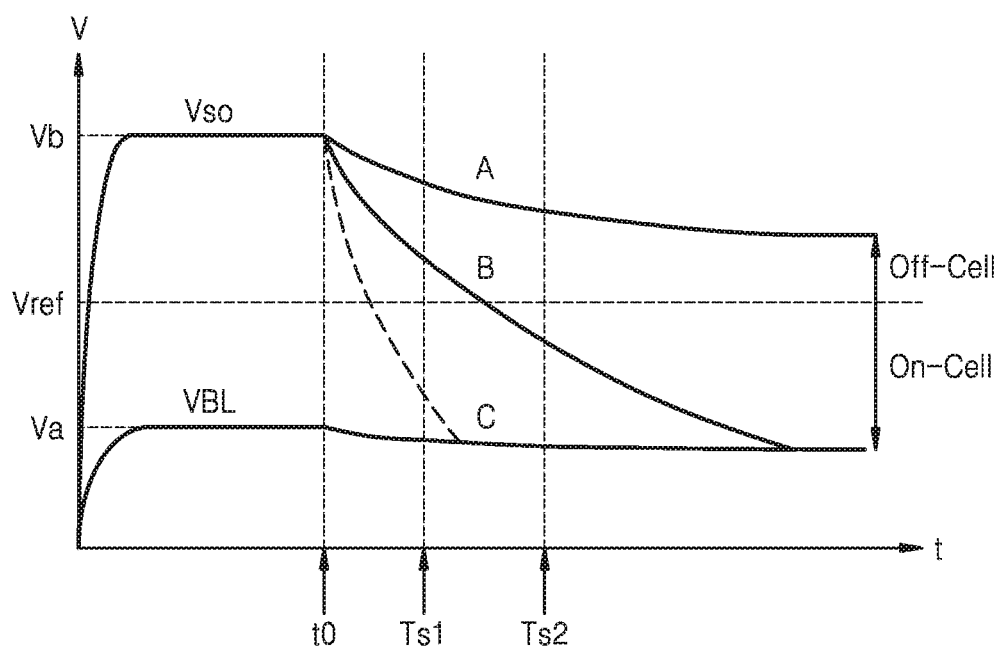
FIG. 8C shows a timing diagram of a program method comprising a two-step sensing operation according to an example embodiment of the present disclosure.

FIG. 8C shows a timing diagram of a program method comprising a two-step sensing operation according to an example embodiment of the present disclosure. In FIG. 8C, the horizontal axis represents a time and the vertical axis represents a voltage level.

In FIG. 8C, 'Va' denotes a voltage pre-charged in the bit line. 'Vb' denotes a voltage pre-charged in the page buffer. A develop operation time after completion of a pre-charge operation is denoted by 't0'. 'A' denotes a memory cell with a threshold voltage corresponding to S5 of FIG. 8A. 'B' denotes a memory cell with a threshold voltage corresponding to S3 of FIG. 8A. 'C' denotes a memory cell with a threshold voltage corresponding to S1 of FIG. 8A.

FIG. 8C illustrates a voltage change of bit line BL and a voltage change of sense-out node SO in the develop operation.

First, pre-charge circuit pre-charges bit line BL and sense-out node SO. In this case, a voltage level VBL pre-charged in bit line BL will be lower than a voltage level VSO pre-charged in sense-out node SO. In this case, the capacitance of bit line BL will be larger than the capacitance of sense-out node SO. Thereafter, a read voltage Vr is applied through a selected word line to selected word lines. Read voltage Vr maintains a constant level during the develop operation.

A develop operation is performed at time t0. The develop operation is performed while bit line BL and sense-out node SO are coupled together. In the develop operation, when the charge pre-charged in bit line BL leaks, the corresponding charge will be supplied from sense-out node SO to bit line BL. Thus, the voltage level pre-charged in sense-out node SO will decrease in proportion to the charge supplied from sense-out node SO to bit line BL.

The currents flowing in the memory cells depend on the threshold voltage distributions of the memory cells. Memory cells with a lower threshold voltage will have a relatively large cell current, and memory cells with a higher threshold voltage have a relatively small cell current. That is, the current flowing in the memory cell is inversely proportional to the threshold voltage level.

When the current flowing in the memory cell is large, the charge pre-charged in bit line BL of the memory cell leaks rapidly. In this case, the charge pre-charged in sense-out node SO is rapidly supplied to bit line BL. This is because the develop operation is performed while sense-out node SO and bit line BL are coupled together. Thus, the voltage level of sense-out node SO of the memory cells with a low threshold voltage decreases faster than the voltage level of sense-out node SO of the memory cells with a high threshold voltage.

Because memory cell 'A' has the highest threshold voltage, the voltage level pre-charged in sense-out node SO corresponding to memory cell 'A' decreases more slowly than the voltage levels pre-charged in sense nodes SO corresponding to memory cells 'B' and 'C'.

Because memory cell 'C' has the lowest threshold voltage, the voltage level pre-charged in sense-out node SO corresponding to memory cell 'C' decreases faster than the voltage levels pre-charged in sense-out nodes SO corresponding to memory cells 'A' and 'B'.

Because memory cell 'B' has a lower threshold voltage than memory cell 'A' and higher than memory cell 'C', the voltage level pre-charged in sense-out node SO corresponding to memory cell 'B' decreases faster than the voltage level pre-charged in sense-out nodes SO corresponding to memory cell 'A' and slower than that corresponding to memory cell 'C'.

First, whether the memory cells with a low threshold voltage are turned on or turned off can be determined at first sense time Ts1. This is because the voltage of sense-out node SO in the memory cells with a low threshold voltage decreases faster than the voltage of sense-out node SO in the memory cells with a high threshold voltage.

At first sense time Ts1, the voltage of sense-out node SO in memory cells 'A' and 'B' is higher than reference voltage Vref. The voltage of sense-out node SO in memory cell 'C' is lower than reference voltage Vref. Thus, memory cells A and B are determined to be turned off, and memory cell 'C' is determined to be turned on. Therefore, memory cell 'C' is determined to have a lower threshold voltage than memory cells 'A' and 'B'.

Whether memory cells with high threshold voltages are turned on or turned off can be determined at second sense time Ts2. This is because the voltage of sense-out node SO in the memory cells with a high threshold voltage decreases more slowly than the voltage of sense-out node SO in the memory cells with a low threshold voltage.

At second sense time Ts2, the voltage of sense-out node SO in memory cell 'A' is higher than reference voltage Vref. The voltage of sense-out node SO in memory cell 'B' is lower than reference voltage Vref. Thus, memory cell 'A' is determined to be turned off, and memory cell 'B' is determined to be turned on. Therefore, memory cell 'B' is determined to have a lower threshold voltage than memory cell 'A'.

As described above, by using different sense times, example embodiments of present disclosure can determine which of S1, S3, and S5 the memory cells are. Because read voltage Vr maintains a constant level, it is unnecessary to vary the read voltage. Thus, example embodiments of present disclosure can reduce the program time by the time taken to vary the read voltage.

Also, some example embodiments of present disclosure perform the bit line pre-charge operation only one time, which can also reduce the time taken to perform the bit line pre-charge operations.

Some example embodiments of present disclosure perform the develop operation while sense-out node SO and bit line BL are coupled together. In these embodiments, the time taken to verify the threshold voltage of the memory cells may be shorter than in embodiments performing the develop operation while sense-out node So and bit line BL are not coupled together. This may be true especially where the capacitance of sense-out node SO is smaller than the capacitance of bit line BL.

Meanwhile, in the example embodiment of FIG. 8C, it has been assumed that the two-step sensing operation is performed after the pre-charge operation of sense-out node SO and bit line BL is performed once. This is merely an example and is not intended to limit the inventive concept.

Figure 9A:
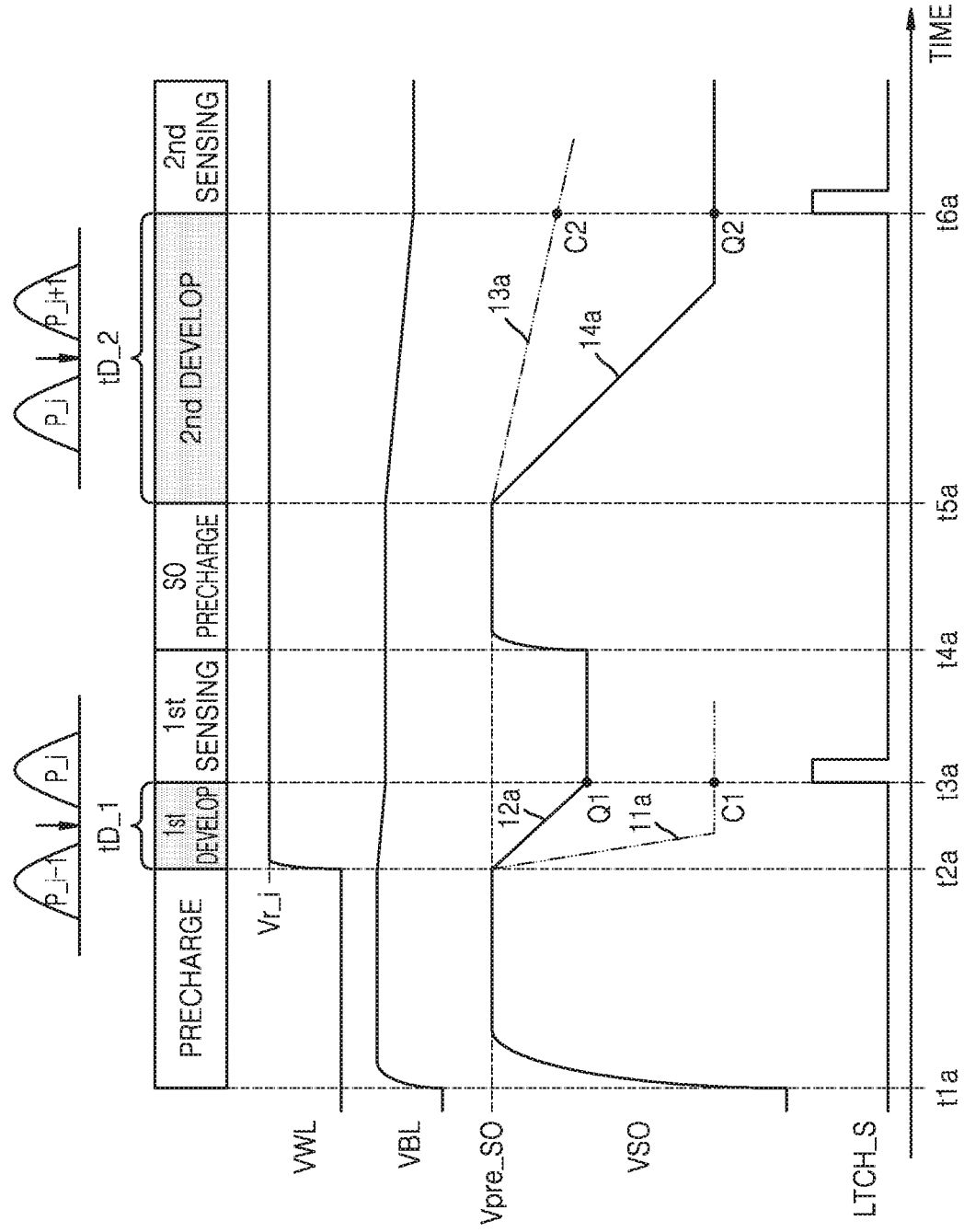
FIGS. 9A through 9C show sensing operation timing diagrams according to an example embodiment of the present disclosure.
Figure 9B:
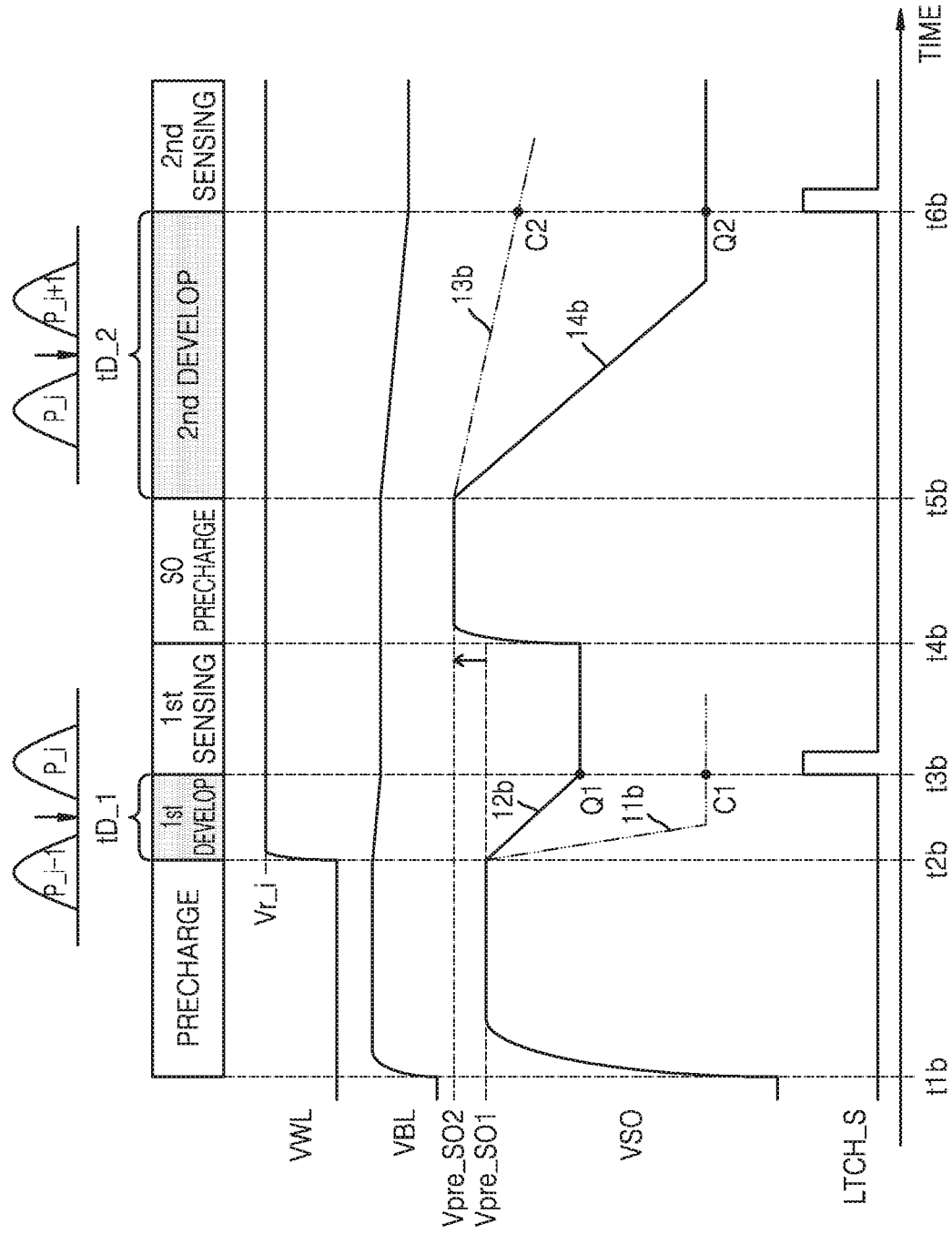
Figure 9C:
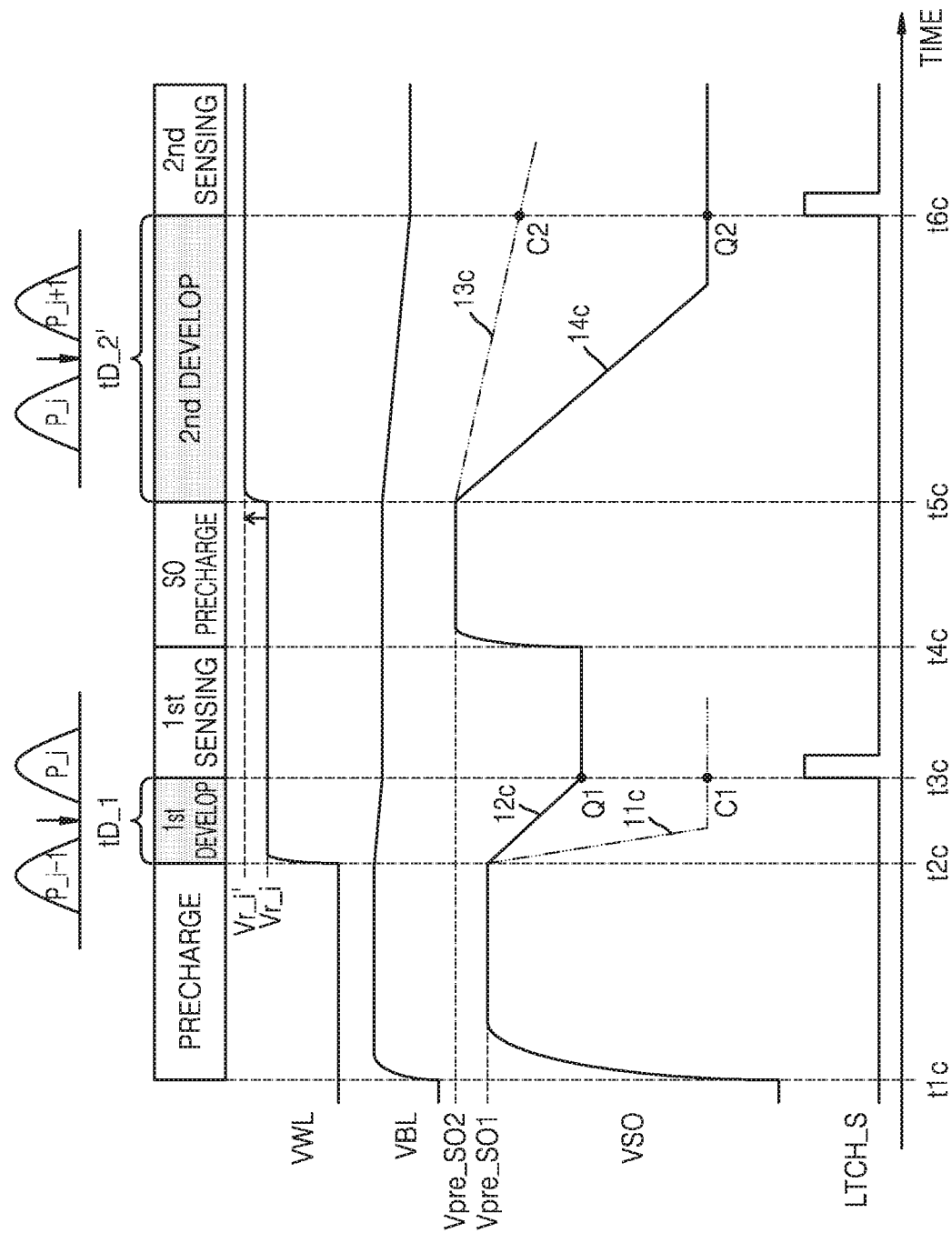

FIGS. 9A through 9C are sensing operation timing diagrams according to an example embodiment of the present disclosure. In particular, for convenience of explanation, it is assumed that the selected memory cell to be sensed corresponds to a cell written in the ith program state P_i.

Referring to FIG. 9A, the sensing operation of a nonvolatile memory device may include a first precharge interval PRECHARGE, a first develop interval 1st DEVELOP, a first sensing interval 1st SENSING, a sense out precharge interval SO PRECHARGE, a second develop interval 2nd DEVELOP, and a second sensing interval 2nd SENSING. Here, the sense-out precharge interval SO PRECHARGE may be referred to as a second precharge interval.

In the first precharge interval PRECHARGE (t1a to t2a), the bit line BL and the sense-out node SO may be precharged. FIG. 9A illustrates a case where the bit line BL and the sense-out SO node are simultaneously precharged, but the embodiment of FIG. 9A is not limited thereto. For example, the sense-out node SO may be precharged after the bit line BL is precharged beforehand. The bit line BL may be precharged to the bit line precharge voltage Vpre_BL (not labelled in FIG. 9A). The sense-out SO node may be precharged so that the sense-out node voltage VSO has a value of the sense-out precharge voltage Vpre_SO. The value of the sense-out precharge voltage Vpre_SO may be a value that the voltage generator 1300 has transmitted to the page buffer circuit 1400 under the control of the sensing controller 1620 of the control logic 1600 of FIG. 2.

In the first develop interval (t2a to t3a), the sense-out node voltage VSO may show a different graph, depending on whether the selected memory cell is the memory cell corresponding to the $(i-1)^{th}$ program state P_i−1 or the memory cell corresponding to the ith program state P_i. At the time t2a at which the first develop interval 1st DEVELOP starts, the $i^{th}$ voltage Vr_i may be applied to the selected word line WL as the first sensing voltage. When the selected memory cell corresponds to the $(i-1)^{th}$ program state P_i−1, the sense-out node voltage VSO may show a shape of a graph 11a during a first develop time tD_1. When the selected memory cell corresponds to the $i^{th}$ program state P_i, the sense-out node voltage VSO may show a shape of a graph 12a during the first develop time tD_1.

At the time t3a when the first sensing interval 1st SENSING starts, the first sensing operation may be performed. During the first sensing operation, when the selected memory cell corresponds to the $(i-1)^{th}$ program state P_i−1, the sense-out node voltage VSO may have a value corresponding to a point C1. During the first sensing operation, when the selected memory cell corresponds to the $i^{th}$ program state P_i, the sense-out node voltage VSO may have a value corresponding to a point Q1. The $i^{th}$ program state P_i may be identified from (distinguished from) the $(i-1)^{th}$ program state P_i−1 in the first sensing interval 1st SENSING by using a voltage difference between the point C1 and the point Q1. This operation may be referred to as identifying the first state corresponding to the $i^{th}$ program state P_i.

In the second precharge interval (t4a to t5a), the sense-out SO node may be precharged again. Referring to FIG. 9A, the sense-out SO node may be precharged to the sense-out precharge voltage Vpre_SO, equal to the sense-out node voltage VSO, that has been precharged in the bit line precharge interval PRECHARGE (t1a to t2a).

In the second develop interval (t5a to t6a), the sense-out node voltage VSO may show a different graph, depending on whether the selected memory cell is the memory cell corresponding to the $i^{th}$ program state P_i or to the $(i+1)^{th}$ program state P_i+1. When the selected memory cell corresponds to the $i^{th}$ program state P_i, the sense-out node voltage VSO may show a shape of a graph 14a during a second develop time tD_2. When the selected memory cell corresponds to the $(i+1)^{th}$ program state P_i+1, the sense-out node voltage VSO may show a shape of a graph 13a during the second develop time tD_2. Here, the second develop time tD_2 may be greater than the first develop time tD_1.

At a time t6a when the second sensing interval 2nd SENSING starts, the second sensing operation may be performed. During the second sensing operation, when the selected memory cell corresponds to the $i^{th}$ program state P_i, the sense-out node voltage VSO may have a value corresponding to a point Q2. During the second sensing operation, when the selected memory cell corresponds to the $(i+1)^{th}$ program state P_i+1, the sense-out node voltage VSO may have a value corresponding to a point C2. The $(i+1)^{th}$ program state P_i+1 may be identified from (distinguished from) the $i^{th}$ program state P_i in the second sensing interval 2nd SENSING by using a voltage difference between the point C2 and the point Q2. This operation may be referred to as identifying the second state corresponding to the $(i+1)^{th}$ program state P_i+1.

Referring to FIG. 9B, the sensing operation of the non-volatile memory device may include the first precharge interval PRECHARGE, the first develop interval 1st DEVELOP, the first sensing interval 1st SENSING, the sense out precharge interval SO PRECHARGE, the second develop interval 2nd DEVELOP, and the second sensing interval 2nd SENSING. Except for differences described below, descriptions overlapping those described with reference to FIG. 9A will be omitted.

In the first precharge interval PRECHARGE (t1b to t2b), the sense node SO may be precharged so that the sense-out node voltage VSO has a value of a first sense-out precharge voltage Vpre_SO1. The value of the first sense-out precharge voltage Vpre_SO1 may be a value that the voltage generator 1300 has transmitted to the page buffer circuit 1400 under the control of the sensing controller 1620 of the control logic 1600 of FIG. 2.

In the second precharge interval SO PRECHARGE (t4b to t5b), the sense node SO may be precharged so that the sense-out node voltage VSO has a value of a second sense-out precharge voltage Vpre_SO2. The value of the second sense-out precharge voltage Vpre_SO2 may be a value that the voltage generator 1300 has transmitted to the page buffer circuit 1400 under the control of the sensing controller 1620 of the control logic 1600 of FIG. 2.

Here, the second sense-out precharge voltage Vpre_SO2 may have a value different from the first sense-out precharge voltage Vpre_SO1. For example, the second sense-out precharge voltage Vpre_SO2 may have a value greater than the first sense-out precharge voltage Vpre_SO1. It may be possible to secure a wider range of the second develop interval 2nd DEVELOP by increasing a magnitude of the precharge voltage of the sense-out SO node, and the sensing margin may be increased when the second sensing 2nd SENSING is performed at the same time.

Referring to FIG. 9C, the sensing operation of the nonvolatile memory device may include the first precharge interval PRECHARGE, the first develop interval 1st DEVELOP, the first sensing interval 1st SENSING, the sense out precharge interval SO PRECHARGE, the second develop interval 2nd DEVELOP, and the second sensing interval 2nd SENSING. Except for differences described below, descriptions overlapping those described with reference to FIGS. 9A and 9B will be omitted.

A voltage applied to the selected word line WL may be changed from the $i^{th}$ read voltage Vr_i to the $i'^{th}$ read voltage Vr_i' at a time t5c at which the second develop interval 2nd DEVELOP (t5c to t6c) starts. In other words, at the time t5c, a second sensing voltage Vr_i' different from the first sensing voltage Vr_i may be applied to the selected word line WL. For example, the $i^{th}$ read voltage Vr_i' may be greater than the $i^{th}$ read voltage Vr_i. However, the $i'^{th}$ read voltage Vr_i' may be less than the $(i+1)^{th}$ read voltage Vr_i+1 because a variation in the develop time is used at the same time. In other words, a difference between the $i^{th}$ read voltage Vr_i and the $i'^{th}$ read voltage Vr_i' may have a value less than the threshold voltage width of the distribution corresponding to the $i^{th}$ program state P_i. The second develop time tD_2' may be reduced compared to the second develop time tD_2 in FIG. 9B, by increasing the voltage applied to the selected word line WL.

With reference to FIGS. 9A, 9B, and 9C, a method of sensing two program states through one bit line precharge PRECHARGE and two sense-out SO node precharges has been described. The sensing method of the nonvolatile memory device as shown in FIGS. 9A, 9B, and 9C may be applicable to sensing two or more program states. For example, three program states may be sensed through one bit line BL precharge and three sense-out SO node precharges. To this end, the sensing method of the nonvolatile memory device according to FIGS. 9A, 9B, and 9C may further include a third precharge interval precharging the sense-out SO node to a third sense-out precharge voltage, and a third sensing interval to identify a third develop interval developing the sense-out SO node from a third state. It will be understood that examples according to the example embodiment of the present disclosure may be applicable to four or more sensings.

Figure 10A:
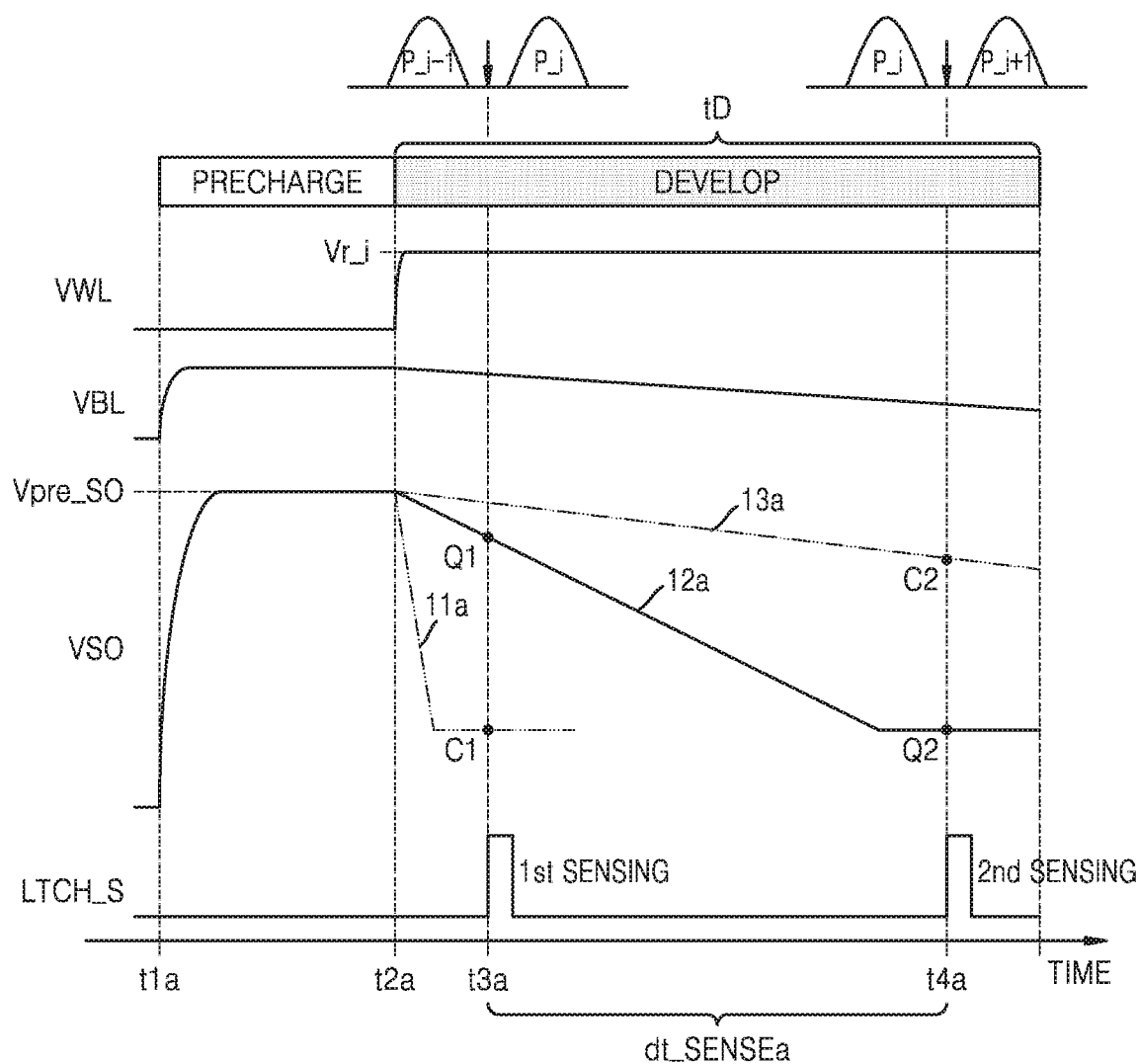
FIGS. 10A and 10B show sensing operation timing diagrams according to another example embodiment of the present disclosure.
Figure 10B:
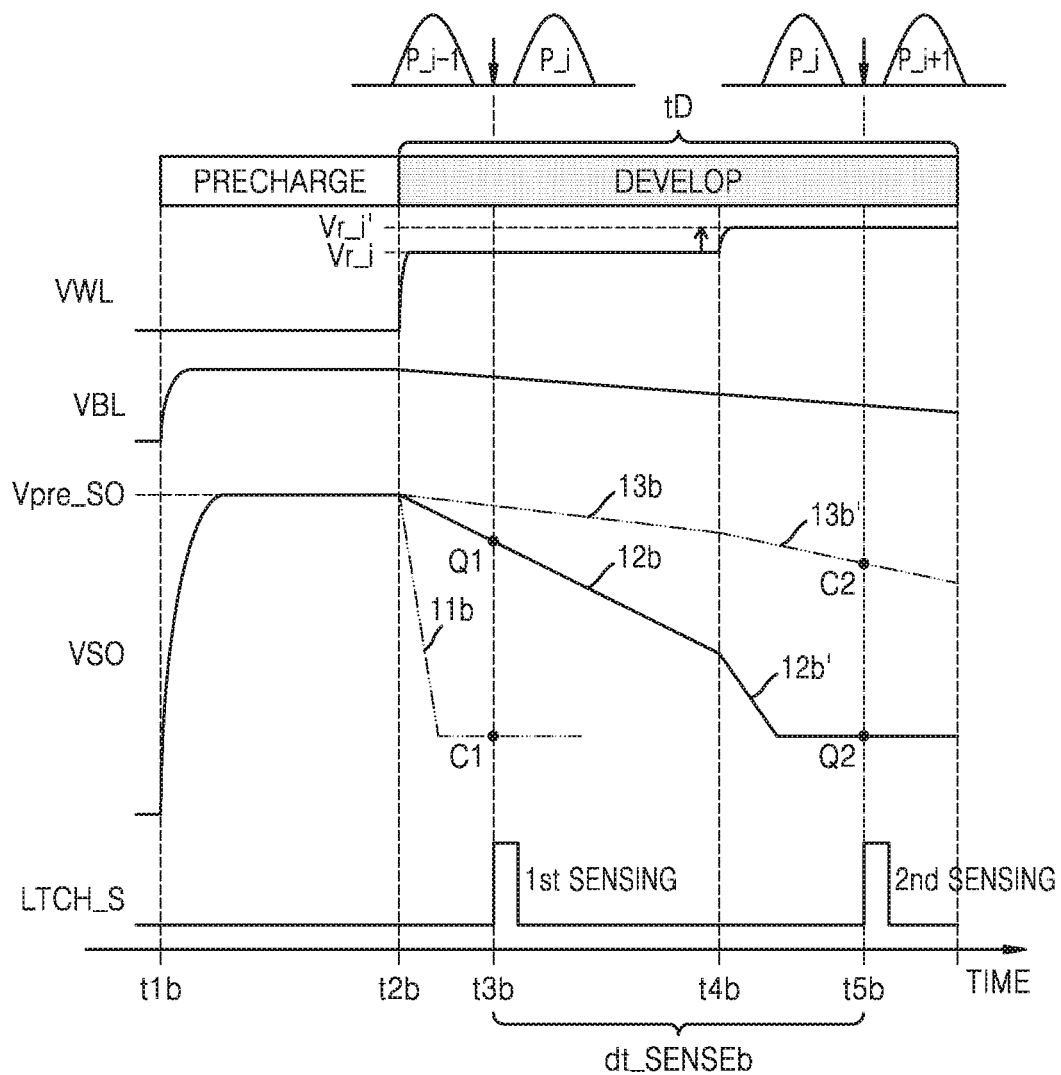

FIGS. 10A and 10B are sensing operation timing diagrams according to another example embodiment of the present disclosure. In particular, for convenience of explanation, it is assumed that the selected memory cell to be sensed corresponds to a cell written in the $i^{th}$ program state P_i.

Referring to FIG. 10A, the sensing operation of the nonvolatile memory device may include the precharge interval PRECHARGE and the develop interval DEVELOP, and may include two sensing operations.

In the precharge interval PRECHARGE (t1a to t2a), the bit line BL and the sense-out SO node may be precharged. FIG. 10A shows a case where the bit line BL and the sense-out SO node are simultaneously precharged, but the embodiment of FIG. 10A is not limited thereto. For example, the sense-out node SO may be precharged after the bit line BL is precharged beforehand. The bit line BL may be precharged to the bit line precharge voltage VBL. The sense-out SO node may be precharged so that the sense-out node voltage VSO has a value of the sense-out precharge voltage Vpre_SO. The value of the sense-out precharge voltage Vpre_SO may be a value that the voltage generator 1300 has transmitted to the page buffer circuit 1400 under the control of the sensing controller 1620 of the control logic 1600 of FIG. 2.

At the time t2a when the develop interval DEVELOP (t2a and beyond) starts, the $i^{th}$ read voltage Vr_i may be applied as the first sensing voltage to the selected word line WL where the selected memory cell is located. In the develop interval DEVELOP, the sense-out node voltage VSO may show a different graph depending on a state in which the selected memory cell is located. For example, when the selected memory cell corresponds to the $(i-1)^{th}$ program state P_i-1, the sense-out node voltage VSO may show a graph 11a. When the selected memory cell corresponds to the $i^{th}$ program state P_i, the sense-out node voltage VSO may show a graph 12a. When the selected memory cell corresponds to the $(i+1)^{th}$ program state P_i+1, the sense-out node voltage VSO may show a graph 13a.

At the time t3a, the first sensing 1st SENSING may be performed. At the time t3a, when the selected memory cell corresponds to the $(i-1)^{th}$ program state P_i-1, the selected memory cell may have a state corresponding to the point C1. At the time t3a, when the selected memory cell corresponds to the $i^{th}$ program state P_i, the selected memory cell may have a state corresponding to the point Q1. Since the sense-out node voltage VSO is different at the point C1 and the point Q1, the $i^{th}$ program state P_i may be identified from (distinguished from) the $(i-1)^{th}$ program state P_i-1.

At the time t4a, the second sensing $2^{nd}$ SENSING may be performed. At the time t4a, when the selected memory cell corresponds to the $i^{th}$ program state P_i, the selected memory cell may have a state corresponding to the point Q2. At the time t4a, when the selected memory cell corresponds to the $(i+1)^{th}$ program state P_i+1, the selected memory cell may have a state corresponding to the point C2. Since the sense-out node voltage VSO is different at the point C2 and the point Q2, the $(i+1)^{th}$ program state P_i+1 may be identified from (distinguished from) the $i^{th}$ program state P_i.

Referring to FIG. 10B, the sensing operation of the nonvolatile memory device may include the precharge interval PRECHARGE and the develop interval DEVELOP, and may include two sensing operations. Except for differences described below, descriptions overlapping those described with reference to FIG. 10A will be omitted.

A voltage applied to the selected word line WL may be changed from the $i^{th}$ read voltage Vr_i to the $i^{th}$ read voltage Vr_i' at a time t4b included in the develop interval DEVELOP. In other words, the second sensing voltage Vr_i' may be applied to the selected word line WL during the develop interval DEVELOP. For example, the $i^{th}$ read voltage Vr_i' may be greater than the $i^{th}$ read voltage Vr_i. However, the $i^{th}$ read voltage Vr_i' may be less than the $(i+1)^{th}$ read voltage Vr_i+1 because a variation in a develop time tD is used at the same time. In other words, the difference between the ith read voltage Vr_i and the i'th read voltage Vr_i' may have a value less than the threshold voltage width of the distribution corresponding to the ith program state P_i. A sensing point interval dt_SENSEb between the first sensing point and the second sensing point may be reduced compared to a sensing point interval dt_SENSEa in FIG. 10A, by increasing the voltage applied to the selected word line WL.

FIGS. 10A and 10B illustrate an embodiment in which a first sensing point t3b and a second sensing point t5b are included in the develop interval DEVELOP (t2b and beyond). According to an embodiment with reference to FIGS. 10A and 10B, the develop interval DEVELOP (t2b and beyond) may be understood as a develop interval including the first develop interval 1st DEVELOP, the first sensing interval 1st SENSING, the second develop interval 2nd DEVELOP, and the second sensing interval 2nd SENSING, compared with descriptions with reference with FIGS. 9A through 9C.

Figure 11:
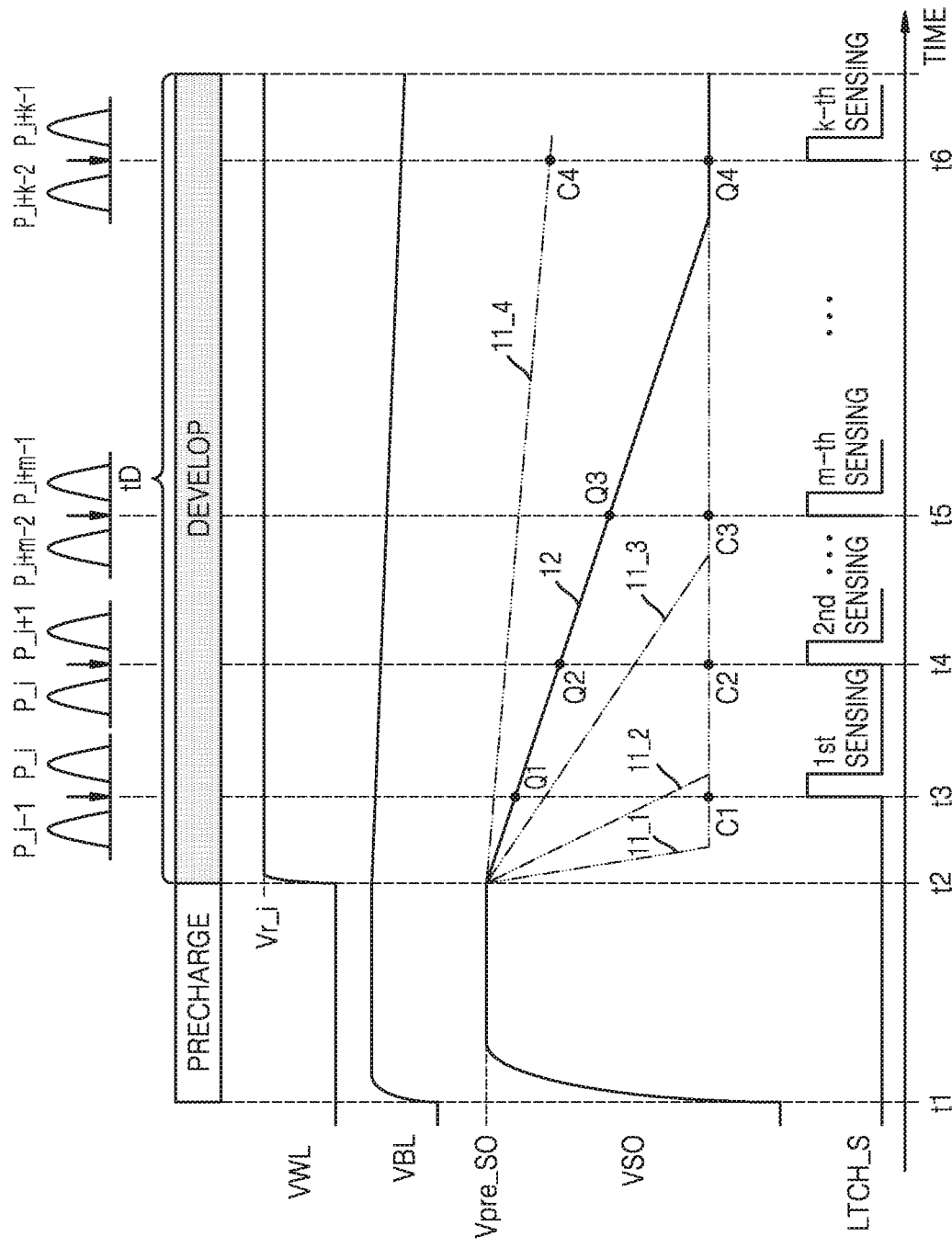
FIG. 11 shows a sensing operation timing diagram according to another example embodiment of the present disclosure.

FIG. 11 is a sensing operation timing diagram according to another example embodiment of the present disclosure. The sensing operation of the nonvolatile memory device may include the precharge interval PRECHARGE and the develop interval DEVELOP, and may include k sensing operations (k is an integer of two or more). Except for differences described below, descriptions overlapping those described with reference to FIGS. 10A and 10B will be omitted. Descriptions will be provided with an assumption that the selected memory cell corresponds to an $(i+m-1)^{th}$ program state P_i+m-1).

At the time t3, the first sensing 1st SENSING may be performed. When the selected memory cell corresponds to the $(i-1)^{th}$ program state P_i-1, the selected memory cell may correspond to C1 at the time t3 according to a shape of a graph 11-1. However, since the selected memory cell corresponds to the $(i+m-1)^{th}$ program state P_i+m-1, the selected memory cell may correspond to Q1 at the time t3 according to a shape of a graph 12. Accordingly, the selected memory cell may be identified from the $(i-1)^{th}$ program state P_i-1.

In the same manner as described above, the second sensing 2nd SENSING at the time t4, the $m^{th}$ sensing mth SENSING at the time t5, and the $k^{th}$ sensing kth SENSING at a time t6 may be performed. Referring to FIGS. 10A, 10B, and 11, it may be possible to sense various program states through one bit line precharge, so that the nonvolatile memory device sensing speed may be increased.

Figure 12:
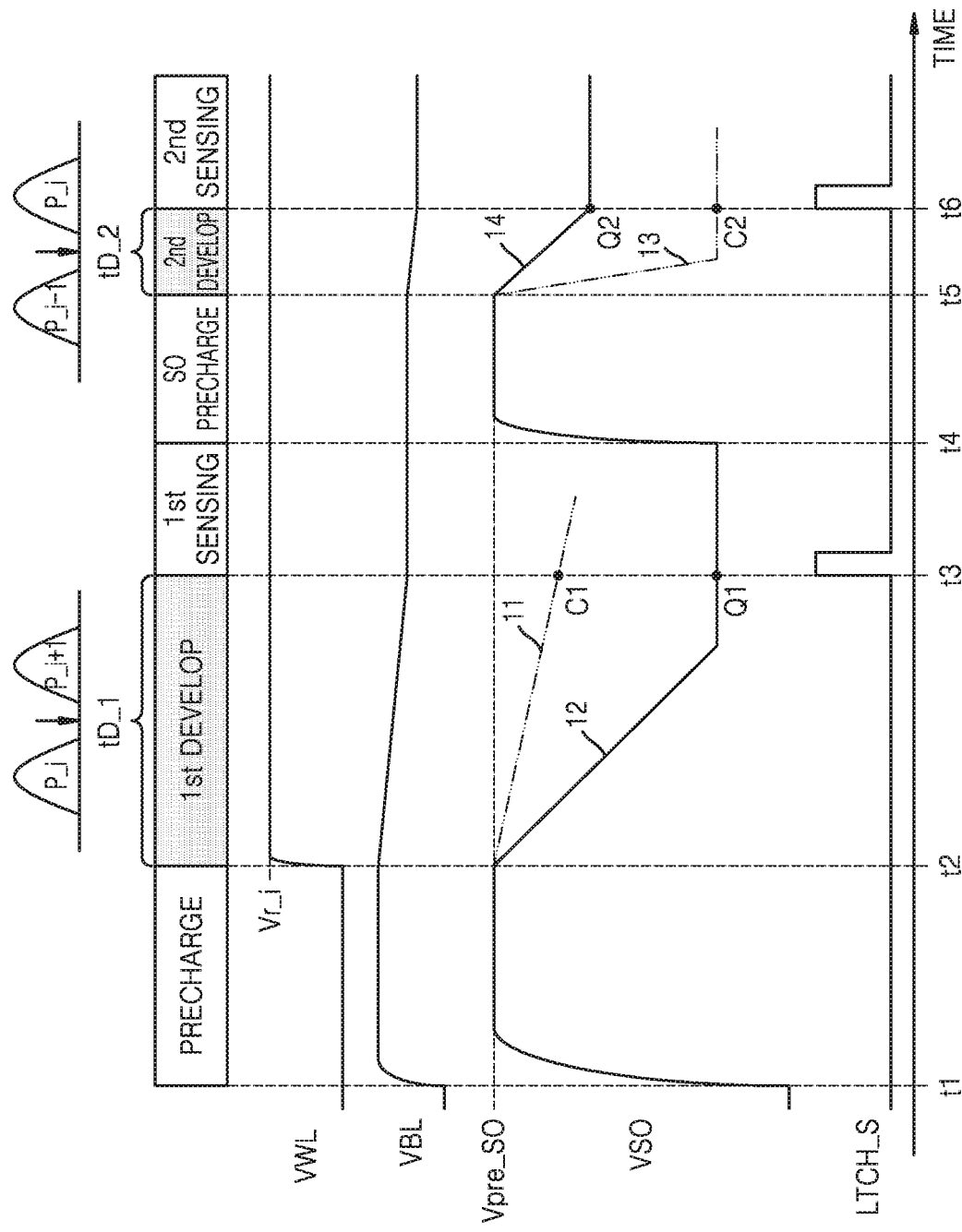
FIG. 12 shows a sensing operation timing diagram according to another example embodiment of the present disclosure.

FIG. 12 is a sensing operation timing diagram according to another example embodiment of the present disclosure. Referring to FIG. 12, the sensing operation of the nonvolatile memory device may include the first precharge interval PRECHARGE, the first develop interval 1st DEVELOP, the first sensing interval 1st SENSING, the sense-out precharge interval SO PRECHARGE, the second develop interval 2nd DEVELOP, and the second sensing interval 2nd SENSING. Except for differences described below, descriptions overlapping those described with reference to FIG. 9A will be omitted.

In the first sensing 1st SENSING after the first develop interval 1st DEVELOP (t2 to t3), the $(i+1)^{th}$ program state P_i+1 may be identified from (distinguished from) the $i^{th}$ program state P_i. In the second sensing 2nd SENSING after the second develop interval 2nd DEVELOP (t5 to t6), the $i^{th}$ program state P_i may be identified from (distinguished from) the $(i-1)^{th}$ program state P_i-1. To this end, the first develop time tD_1 may be longer than the second develop time tD_2.

In an embodiment, the sense-out node voltage VSO may be precharged to a different voltage in the first precharge interval PRECHARGE (t1 to t2) and the second precharge interval SO PRECHARGE (t4 to t5), in a similar manner to that described with reference to FIG. 9B. For example, the first sense-out precharge voltage VSO1 (not labelled in FIG. 12) precharged in the first precharge interval PRECHARGE (t1 to t2) may be greater than the second sense-out precharge voltage VSO2 (not labelled in FIG. 12) precharged in the second precharge interval SO PRECHARGE (t4 to t5).

In a further embodiment, the magnitude of the voltage applied to the selected word line WL may be changed at the time t5, in a similar manner to that described with reference to FIG. 9C. For example, at the time t5, the magnitude of the voltage applied to the selected word line WL may be reduced. In other words, the second sensing voltage applied to the selected word line WL at the time t5 may be less than or more than the first sensing voltage applied to the selected word line WL at the time t2.

Figure 13:
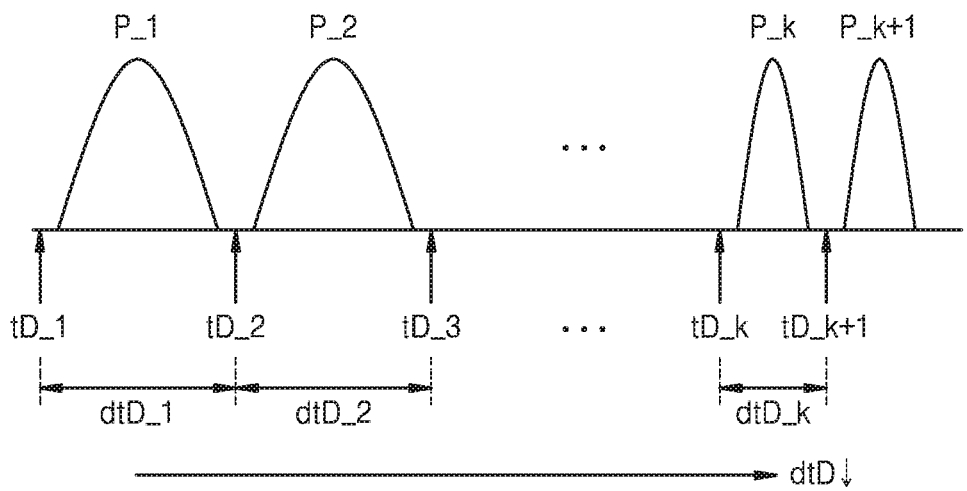
FIG. 13 shows a portion of a distribution according to the threshold voltage of a multi-level cell according to an example embodiment of the present disclosure.

FIG. 13 illustrates a portion of a distribution according to a threshold voltage of a multi-level cell according to an example embodiment of the present disclosure. In the case of the multi-level cell, a distribution of a program state having a lower threshold voltage, that is, a state in which a smaller amount of electrons is injected into the floating gate, may have a greater width than a distribution of a state in which a larger amount of electrons is injected into the floating gate. In FIG. 13, the smaller threshold voltage among threshold voltages for two adjacent program states P_k and P_k+1 is greater than the greater threshold voltage among threshold voltages for two adjacent program states P_1 and P_2 to the left of P_k and P_k+1.

Thus, in applying the sensing method of the nonvolatile memory device according to FIGS. 9A through 12, it may be necessary to control differently a difference value in the develop times depending on a program state to be sensed. For example, when the first program state P_1 and the second program state P_2 are to be sensed after one bit line precharge, the first develop time tD_1 and the second develop time tD_2 may be applied to a time interval between the first develop interval 1st DEVELOP and the second develop interval 2nd DEVELOP. A difference between the second develop time tD_2 and the first develop time tD_1 may be referred to as a first develop time difference dtD_1 or a first develop time change amount. Distribution widths of the lower states may be larger than distribution widths of the higher states. On opposite extremes, a distribution width of the $(k+1)^{th}$ program state P_k+1 is narrower than the distribution width of the first program state P_1. Thus, the second develop time difference dtD_2 is smaller than the first develop time difference dtD_1, but larger than the $k^{th}$ develop time difference dtD_k. Since a distribution width of the $(k+1)^{th}$ program state P_k+1 is much narrower than the distribution width of the first program state P_1, the $k^{th}$ develop time difference dtD_k may be much less than the first develop time difference dtD_1. In other words, as the sensing operation senses a state having more electrons injected, the sensing operation may be performed by reducing a variation in the develop time. Therefore, a develop time is reduced for higher program states compared to lower program states, and the difference between the develop time change amounts for adjacent lower program states (e.g., P_1 and P_2) is larger than the difference between develop time change amounts for adjacent higher program states (e.g., P_k and P_k+1)

Figure 14:
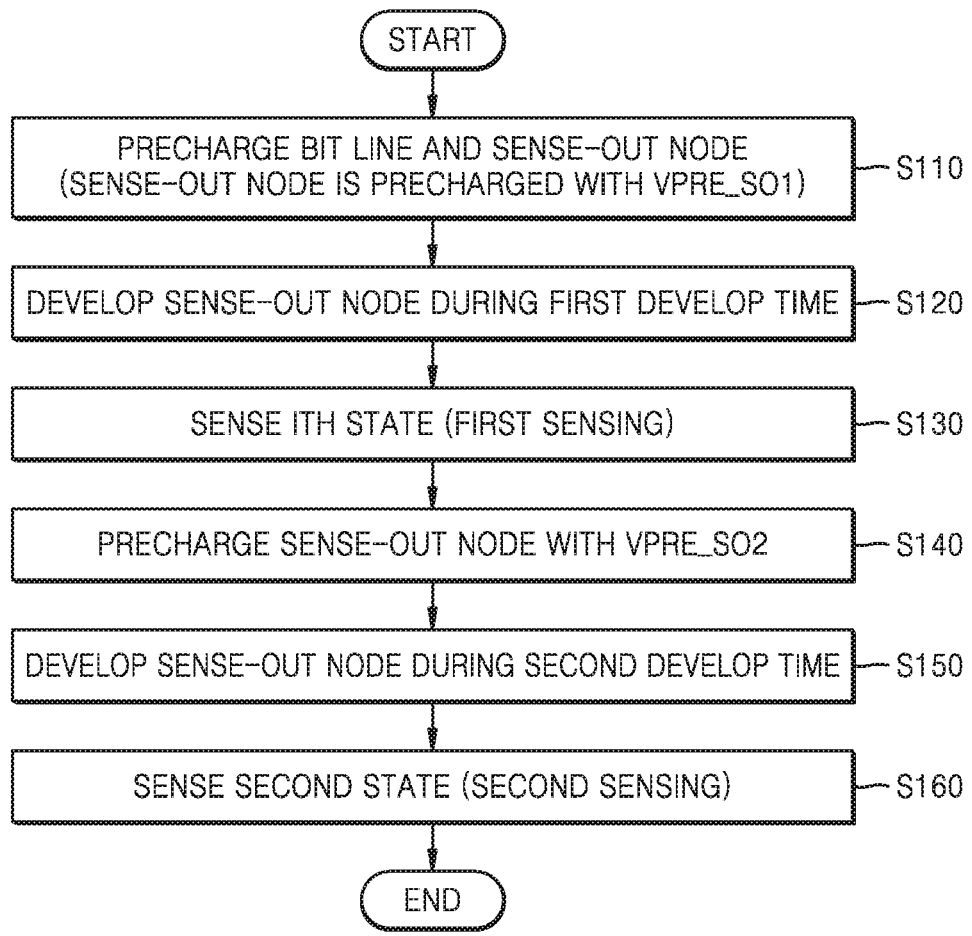
FIG. 14 shows a flowchart of a sensing operation according to an example embodiment of the present disclosure.

FIG. 14 is a flowchart for explaining a sensing operation according to an example embodiment of the present disclosure.

Referring to FIGS. 9C and 14, the bit line BL may be precharged to the bit line precharge voltage Vpre_BL (not labelled in FIG. 9C) in the first precharge interval PRECHARGE, and the sense-out SO node may be precharged to the first sense node precharge voltage Vpre_SO1 (S110). After the bit line BL and the sense-out SO node are precharged, the sense-out SO node may be developed during the first develop time tD_1 in the first develop interval 1st DEVELOP (S120). In the first develop interval 1st DEVELOP, the first sensing voltage may be applied to the selected word line WL where the selected memory cell is located. After the sense-out SO node is developed in the first develop interval 1st DEVELOP, the $i^{th}$ program state P_i of the selected memory cell may be identified by sensing the first voltage level of the sense-out SO node in the first sensing interval 1st SENSING (S130). The identification of the $i^{th}$ program state P_i may be referred to as the sensing of the first state. After the $i^{th}$ state P_i is identified in the first sensing, the sense-out SO node may be precharged to the second sense-out node precharge voltage Vpre_SO2 in the second precharge interval SO PRECHARGE (S140). Thereafter, the sense-out SO node may be developed during the second develop time tD_2' in the second develop interval 2nd DEVELOP (S150). In the second develop interval 2nd DEVELOP, the second sensing voltage may be applied to the selected word line WL where the selected memory cell is located. The $(i-1)^{th}$ program state P_i-1 and the $(i+1)^{th}$ program state P_i+1 of the selected memory cell may be identified from (distinguished from) each other by sensing the second voltage level of the sense-out SO node in the second sensing interval 2nd SENSING after the develop interval 2nd DEVELOP (S160). The identification of (differentiation between) the $(i-1)^{th}$ program state P_i-1 from the $(i+1)^{th}$ program state P_i+1 may be referred to as the sensing of the second state. In other words, the forward HSR sensing or the backward HSR sensing may be performed in the HSR sensing in which each of program states of the memory cell are sequentially sensed. The process of FIG. 14 may be referred to as a sensing loop, and may be repeatedly performed for/on a selected memory cell connected to a selected word line as multiple sensing loops. For example, multiple sensing loops may include a first sensing loop that identifies (distinguishes) a first state from a second state, and a second sensing loop that identifies (distinguishes) a third state from a fourth state. As noted with respect to FIG. 13 above, the develop time difference (develop time change amount) for adjacent lower program states is larger than the develop time difference (develop time change amount) for adjacent higher program states.

Figure 15:
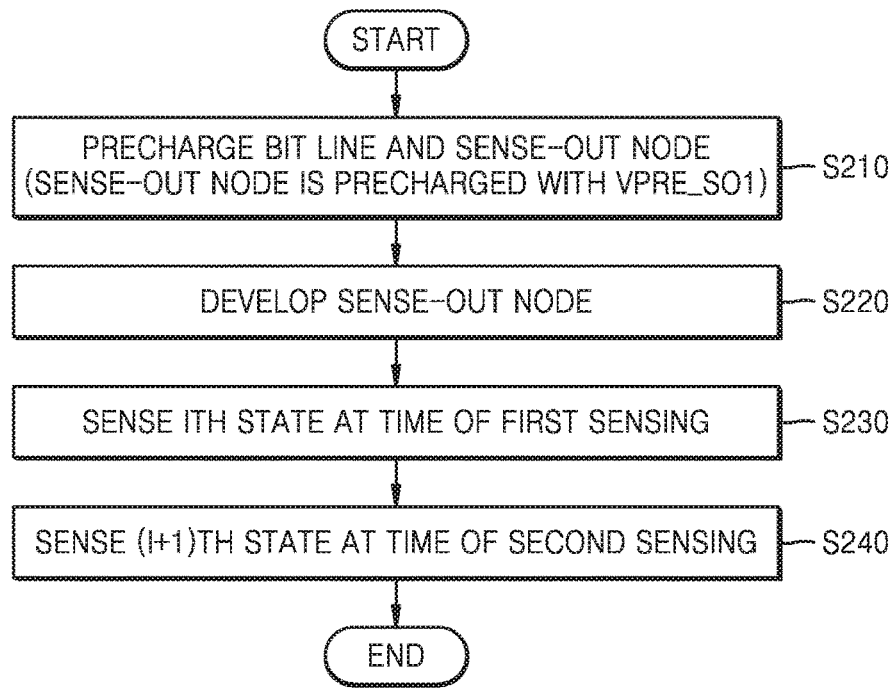
FIG. 15 shows a flowchart of a sensing operation according to another example embodiment of the present disclosure.

FIG. 15 is a flowchart for explaining a sensing operation according to another example embodiment of the present disclosure.

Referring to FIGS. 10A and 15, the bit line BL may be precharged to the bit line precharge voltage Vpre_BL (not labelled in FIG. 10A) in the precharge interval PRECHARGE, and the sense-out SO node may be precharged to the sense node precharge voltage Vpre_SO (S210). The sense-out SO node may be developed in the develop interval DEVELOP after the bit line BL and the sense-out SO node are precharged (S220). The $i^{th}$ program state P_i of the selected memory cell may be identified by sensing the first voltage level of the sense-out SO node at the first sensing point or t3a in the develop interval DEVELOP (S230). The $i^{th}$ program state P_i of the selected memory cell may be identified by sensing the second voltage level of the sense-out SO node at the second sensing point or t4a in the develop interval DEVELOP (S240). In an embodiment with reference to FIG. 10B, a higher word line voltage may be applied to the selected word line WL prior to the second sensing point t4a.

According to the sensing method of the nonvolatile memory device with reference with FIGS. 14 and 15, it may be possible to sense two or more program states of the selected memory cell by only one bit line precharge. As a result, the time required for the data read operation and the data write verify operation in the multi-level cell may be reduced.

Figure 16:
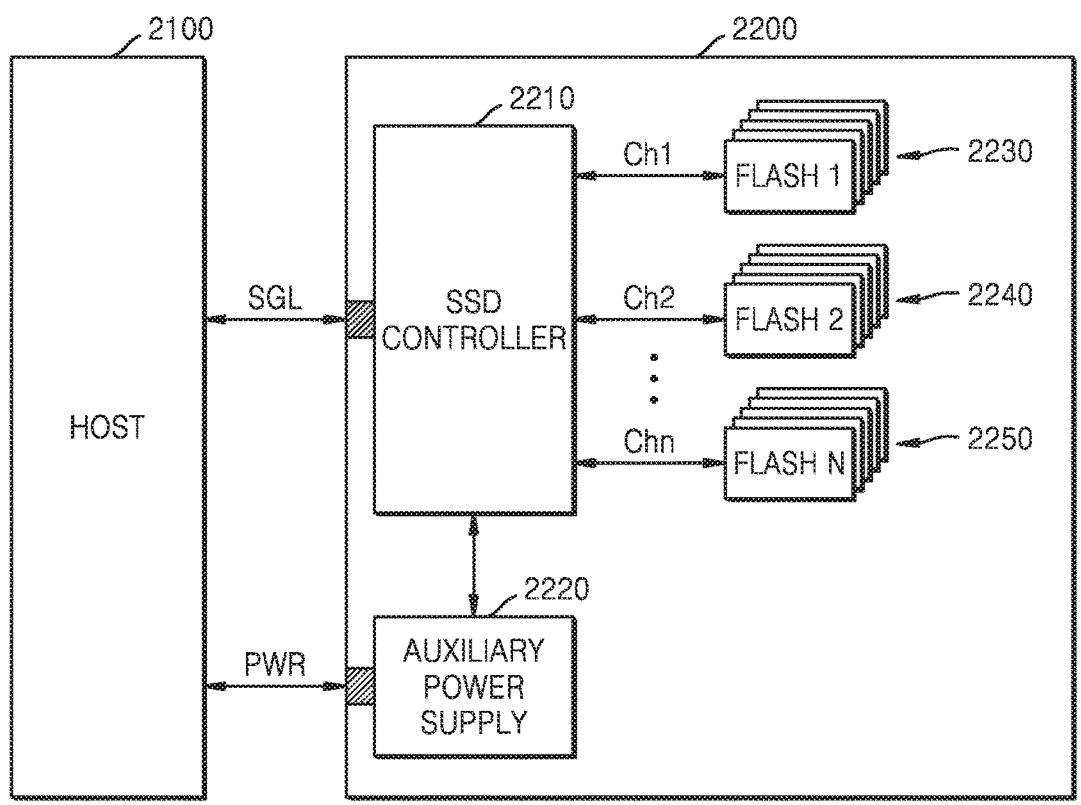
FIG. 16 shows a solid-state drive (SSD) system according to an example embodiment of the present disclosure.

FIG. 16 shows a solid-state drive system 2000 (SSD) according to an example embodiment of the present disclosure.

The SSD system 2000 may include a host 2100 and an SSD 2200. The SSD 2200 may exchange signals with the host 2100 through a signal connector and receive power through a power connector. The SSD 2200 may include an SSD controller 2210, an auxiliary power supply 2220 and multiple memory devices 2230, 2240 and 2250. The memory devices 2230, 2240, and 2250 may be vertically stacked NAND flash memory devices. In this case, at least one of the memory devices 2230, 2240, and 2250 may be configured to perform the data read operation or the data write verify operation by using the sensing method described above with reference to FIGS. 1 through 15.

As described above, example embodiments have been disclosed in the drawings and specification. While embodiments have been described herein with reference to specific terms, it should be understood that they have been used only for the purpose of describing the technical idea of the present disclosure and not for limiting the scope of the present disclosure as defined in the claims. Therefore, it will be clearly understood by one of ordinary skill in the art that various modifications and equivalent embodiments are possible without departing from the scope of the present disclosure. Accordingly, the true scope of protection of the present disclosure should be determined by the technical idea of the following claims.

What is claimed is:

1. A sensing method of a nonvolatile memory device comprising multiple multi-level cells, the sensing method comprising:
   precharging, during a first precharge interval, a bit line of a selected memory cell and a sense-out node connected to the bit line to a bit line precharge voltage and a first sense-out precharge voltage, respectively;
   identifying a first state of the selected memory cell, by developing the sense-out node during a first develop time and sensing a first voltage level of the sense-out node at a first sensing point;
   precharging the sense-out node to a second sense-out precharge voltage during a second precharge interval; and
   identifying a second state of the selected memory cell, by developing the sense-out node during a second develop time different from the first develop time and sensing a second voltage level of the sense-out node at a second sensing point,
   wherein the second state is a program state adjacent to the first state.

2. The sensing method of claim 1, wherein the second state corresponds to a program state in which more electrons are injected to a floating gate of the selected memory cell than the first state, and the second develop time is longer than the first develop time.

3. The sensing method of claim 2, wherein the second sense-out precharge voltage is greater than the first sense-out precharge voltage.

4. The sensing method of claim 2, further comprising:
   applying a first sensing voltage to a selected word line where the selected memory cell is located prior to the first sensing point; and
   applying a second sensing voltage different from the first sensing voltage to the selected word line prior to the second sensing point.

5. The sensing method of claim 4, wherein the second sensing voltage is greater than the first sensing voltage, and a difference between the second sensing voltage and the first sensing voltage is less than a threshold voltage width of a distribution corresponding to the first state.

6. The sensing method of claim 1, further comprising:
   precharging the sense-out node to a third sense-out precharge voltage during a third precharge interval; and
   identifying a third state adjacent to the second state of the selected memory cell, by developing the sense-out node during a third develop time different from the first develop time and the second develop time, and sensing a third voltage level of the sense-out node at a third sensing point.

7. The sensing method of claim 6, wherein the third state corresponds to a program state in which more electrons are injected to a floating gate of the selected memory cell than the second state, and the second state corresponds to a program state in which more electrons are injected to the floating gate of the selected memory cell than the first state, and the third develop time is longer than the second develop time and the second develop time is longer than the first develop time.

8. The sensing method of claim 1, wherein the first state corresponds to a program state in which more electrons are injected to a floating gate of the selected memory cell than the second state, and the first develop time is longer than the second develop time.

9. The sensing method of claim 8, wherein the first sense-out precharge voltage is greater than the second sense-out precharge voltage.

10. The sensing method of claim 8, further comprising:
    applying a first sensing voltage to a selected word line where the selected memory cell is located prior to the first sensing point; and
    applying a second sensing voltage less than the first sensing voltage to the selected word line prior to the second sensing point,
    wherein a difference between the first sensing voltage and the second sensing voltage is less than a threshold voltage width of a distribution corresponding to the first state.

11. The sensing method of claim 1, wherein the nonvolatile memory device comprises a control logic, and the first sense-out precharge voltage, the second sense-out precharge voltage, the first develop time, and the second develop time are values controlled by the control logic.

12. A sensing method of a nonvolatile memory device comprising a plurality of multi-level cells, the method comprising:
    precharging a bit line of a selected memory cell and a sense-out node connected to the bit line;
    applying a first sensing voltage to a selected word line where the selected memory cell is located;
    developing the sense-out node during a develop interval; and
    sensing the sense-out node multiple times during the develop interval,
    wherein the sensing the sense-out node multiple times comprises:
    identifying a first state of the selected memory cell by sensing a first voltage level of the sense-out node at a first sensing point in the develop interval; and
    identifying a second state of the selected memory cell by sensing a second voltage level of the sense-out node at a second sensing point after the first sensing point,
    wherein the second state is a program state adjacent to the first state.

13. The sensing method of the nonvolatile memory device comprising the plurality of multi-level cells of claim 12, wherein the second state corresponds to a program state in which more electrons are injected to a floating gate of the selected memory cell than the first state.

14. The sensing method of claim 12, wherein the sensing the sense-out node multiple times further comprises applying a second sensing voltage greater than the first sensing voltage to the selected word line prior to the second sensing point, wherein a difference between the second sensing voltage and the first sensing voltage is less than a threshold voltage width of a distribution corresponding to the first state.

15. The sensing method of claim 12, wherein each of the plurality of multi-level cells comprises at least one quadruple level cell (QLC).

16. A sensing method of a nonvolatile memory device comprising a plurality of multi-level cells and being configured to perform a plurality of sensing loops of a selected memory cell connected to a selected word line, the sensing method, performed by at least one sensing loop among the plurality of sensing loops, comprising:
  precharging a bit line connected to the selected memory cell during a first precharge interval;
  precharging a sense-out node connected to the bit line to a first sense-out precharge voltage during the first precharge interval;
  developing the sense-out node during a develop time;
  sensing an $i^{th}$ program state (i is an integer) of the selected memory cell by sensing a first voltage level of the sense-out node during a first sensing interval;
  precharging the sense-out node to a second sense-out precharge voltage during a second precharge interval;
  developing the sense-out node for a period longer than the develop time by a change amount in the develop time; and
  sensing an $(i+1)^{th}$ program state of the selected memory cell by sensing a second voltage level of the sense-out node during a second sensing interval.

17. The sensing method of claim 16, wherein the plurality of sensing loops comprise a first sensing loop identifying a first state from a second state of the selected memory cell and a second sensing loop identifying a third state from a fourth state, wherein a first develop time change amount that is a develop time change amount of the first sensing loop is different from a second develop time change amount that is the develop time change amount of the second sensing loop.

18. The sensing method of claim 17, wherein a threshold voltage of a state having a smaller threshold voltage between the threshold voltage of the third state and the threshold voltage of the fourth state is greater than a threshold voltage of a state having a greater threshold voltage between the threshold voltage of the first state and the threshold voltage of the second state, and the first develop time change amount is greater than the second develop time change amount.

19. The sensing method of claim 16, wherein the second sense-out precharge voltage is greater than the first sense-out precharge voltage.

20. The sensing method of claim 16, further comprising increasing, by the at least one sensing loop among the plurality of sensing loops, a magnitude of a voltage applied to the selected word line prior to the second sensing interval.

* * * * *